(12) United States Patent
Suematsu et al.

(10) Patent No.: US 9,608,226 B2
(45) Date of Patent: Mar. 28, 2017

(54) METHOD FOR MANUFACTURING TRANSPARENT ELECTRODE

(71) Applicant: Konica Minolta, Inc., Tokyo (JP)

(72) Inventors: Takatoshi Suematsu, Tokyo (JP); Akihiko Takeda, Kanagawa (JP); Masaki Goto, Tokyo (JP); Toshiyuki Matsumura, Kanagawa (JP)

(73) Assignee: Konica Minolta, Inc., Tokyo (JP)

( * ) Notice: Subject to any disclaimer, the term of this patent is extended or adjusted under 35 U.S.C. 154(b) by 120 days.

(21) Appl. No.: 14/381,822

(22) PCT Filed: Feb. 14, 2013

(86) PCT No.: PCT/JP2013/053445
§ 371 (c)(1),
(2) Date: Aug. 28, 2014

(87) PCT Pub. No.: WO2013/129116
PCT Pub. Date: Sep. 6, 2013

(65) Prior Publication Data
US 2015/0053950 A1    Feb. 26, 2015

(30) Foreign Application Priority Data
Feb. 29, 2012  (JP) .................................. 2012-042718

(51) Int. Cl.
| H01L 51/52 | (2006.01) |
| H01B 1/24 | (2006.01) |
| H01L 51/00 | (2006.01) |
| H01L 31/0224 | (2006.01) |
| H01L 31/18 | (2006.01) |
| H05K 1/02 | (2006.01) |
| H05K 3/24 | (2006.01) |
| H05K 3/46 | (2006.01) |
| H05K 3/12 | (2006.01) |
| H05K 1/03 | (2006.01) |

(52) U.S. Cl.
CPC .......... *H01L 51/5212* (2013.01); *H01B 1/24* (2013.01); *H01L 31/022466* (2013.01);
(Continued)

(58) Field of Classification Search
USPC .................................................. 427/108, 110
See application file for complete search history.

(56) References Cited

U.S. PATENT DOCUMENTS

| 2001/0044492 A1* | 11/2001 | Schwark | G03C 1/89 |
| | | | 524/539 |
| 2008/0118669 A1* | 5/2008 | Inoue | G02B 1/111 |
| | | | 428/1.31 |

(Continued)

FOREIGN PATENT DOCUMENTS

| JP | 2005-302508 A | 10/2005 |
| JP | 2008-541471 A | 11/2008 |

(Continued)

OTHER PUBLICATIONS

International Search Report for corresponding International Application No. PCT/JP2013/053445, mailed Apr. 2, 2013 (1 page).

(Continued)

*Primary Examiner* — Brian K Talbot
(74) *Attorney, Agent, or Firm* — Osha Liang LLP

(57) ABSTRACT

A method for forming a transparent electrode includes a step of forming a thin metal wire on a transparent substrate; and a step of forming a transparent conductive layer on the transparent substrate and the thin metal wire. The step of forming the transparent conductive layer is a step of forming the transparent conductive layer by applying an application liquid onto the transparent substrate and the thin metal wire by printing. The application liquid is composed of a conductive polymer, a water-soluble binder having a structural unit represented by the following general formula (I), a polar solvent having a log P value of $-1.50$ to $-0.45$, and 5.0 to 25 mass % of a glycol ether.

[Chem. 1]

General Formula (I)

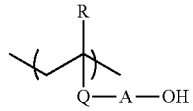

17 Claims, 4 Drawing Sheets

(52) U.S. Cl.
CPC ...... *H01L 31/1884* (2013.01); *H01L 51/0022* (2013.01); *H01L 51/0096* (2013.01); *H05K 1/0274* (2013.01); *H05K 3/245* (2013.01); *H05K 3/4664* (2013.01); *H05K 1/0306* (2013.01); *H05K 3/125* (2013.01); *H05K 3/1275* (2013.01); *H05K 2201/0108* (2013.01); *H05K 2201/0329* (2013.01); *Y02E 10/50* (2013.01)

(56) References Cited

U.S. PATENT DOCUMENTS

| | | | | |
|---|---|---|---|---|
| 2009/0244027 | A1* | 10/2009 | Yoshida | C08J 7/047 345/174 |
| 2010/0247870 | A1* | 9/2010 | Suzuki | B22F 1/0059 428/172 |
| 2010/0255323 | A1 | 10/2010 | Nakamura et al. | |
| 2011/0026126 | A1* | 2/2011 | Takada | B32B 23/08 359/601 |
| 2011/0139253 | A1* | 6/2011 | Wachi | H01L 51/442 136/263 |
| 2013/0101732 | A1* | 4/2013 | Nakamura | H01B 1/22 427/108 |

FOREIGN PATENT DOCUMENTS

| | | |
|---|---|---|
| JP | 2009-087843 A | 4/2009 |
| WO | 2006123167 A1 | 11/2006 |

OTHER PUBLICATIONS

International Preliminary Report on Patentability and Written Opinion in corresponding International Application No. PCT/JP2013/053445, mailed Sep. 12, 2014 (5 pages).

\* cited by examiner

METHOD FOR MANUFACTURING TRANSPARENT ELECTRODE

TECHNICAL FIELD

Embodiments of the invention relate to a transparent electrode manufacturing method, a transparent electrode obtained thereby and an organic electronic device using the transparent electrode.

BACKGROUND

In recent years, organic electronic devices such as organic electroluminescent devices ("organic EL device(s)" hereinafter) and organic solar cells have attracted attention. For any of these organic electronic devices, a transparent electrode is an essential component.

A conventional transparent electrode having been widely used is an ITO transparent electrode manufactured by forming an indium-tin composite oxide (abbreviated to "ITO" hereinafter) film by vacuum deposition or sputtering on a transparent substrate because of its advantages in properties such as conductivity and transparency.

However, the transparent electrode manufactured by vacuum deposition or sputtering is low in productivity, which brings a financial problem of high manufacturing costs. Further, in recent years, there has been a strong demand for organic electronic devices having a larger area. Such organic electronic devices require a large vacuum facility for vacuum deposition, sputtering or the like, which is a great financial burden. In addition, resistance of an ITO transparent electrode has been insufficient.

For the area increase and also for organic electronic devices which are demanded to have a low resistance, there has been developed a transparent electrode composed of: a thin metal wire formed in a pattern; and a transparent conductive layer composed of a conductive polymer and the like stacked on the thin metal wire, and having both current uniformity in surface and high conductivity (refer to Patent Documents 1 and 2, for example).

However, with the method described in Patent Document 1, the coated film of ITO dispersoids itself used for forming the transparent conductive layer is not smooth, and hence there is a problem of current leakage in the case where the transparent electrode is used in an organic electronic device. Meanwhile, with the method described in Patent Document 2, smoothness of the conductive polymer itself has no problem, but it is necessary to smoothen asperity of the thin metal wire with the transparent conductive layer composed of the conductive polymer and the like, and therefore it is essential to thicken the conductive polymer. A conductive polymer, however, shows absorption in the visible light region. Therefore, if the conductive polymer is thickened, the transparency of the transparent electrode significantly decreases.

As a method to achieve both the conductivity and the transparency, which is a problem as described above, there is disclosed a method of using a hydroxyalkyl group-containing acrylic polymer such as poly(hydroxyethyl acrylate) for a transparent conductive layer (refer to Patent Document 3, for example).

However, the application liquid containing the conductive polymer and the hydroxyalkyl group-containing acrylic polymer, which is described in Patent Document 3, increases its viscosity with the lapse of time, and hence there is a problem in stability of the application liquid over time, so-called pot life. In particular, in the case where a transparent conductive layer is formed by inkjet printing, if an application liquid having such viscosity variability is used and ejected continuously, nozzle clogging occurs at a part of an inkjet recording head(s) with viscosity increase when the ejection is carried out several ten times. Thus, ejection stability cannot be maintained.

In addition, although it depends on a solvent to select, there are problems that: a gel insoluble matter is generated in the application liquid; and at a step of drying the application liquid, the coated film is contracted and therefore cannot keep a desired shape which is a shape right after the application, namely, a designed shape. If a transparent electrode manufactured by using the application liquid in which a gel insoluble matter is generated is used in an organic electronic device, current leakage occurs in the organic electronic device, and a rectification ratio thereof substantially decreases. In addition, the application liquid is wet-spread at the drying step, and therefore pattern accuracy decreases, and also current leakage in wiring may be caused. Meanwhile, if the formed coated film is contracted by being dried, the area of the transparent conductive layer decreases, so that the edges of the thin metal wire are not covered therewith and are exposed therefrom, which leads to decrease in the rectification ratio of an organic electronic device.

As a method for giving a conductive polymer onto a substrate having asperity by inkjet printing, there is also disclosed a method of using a solvent such as an ethylene glycol or an ethylene glycol ether (refer to Patent Document 4, for example).

However, even with the method described in Patent Document 4, in the existing circumstances, not all of the above problems have been solved yet.

RELATED ART DOCUMENT

Patent Document

Patent Document 1: Japanese Patent Application Laid-Open Publication No. 2005-302508
Patent Document 2: Japanese Patent Application Laid-Open Publication No. 2009-087843
Patent Document 3: U.S. Patent Application Publication No. 2010/255323
Patent Document 4: Published Japanese Translation of PCT International Publication for Patent Application No. 2008-541471

SUMMARY OF THE INVENTION

Embodiments of the invention provide: a transparent electrode manufacturing method using a transparent conductive layer forming application liquid excellent in stability over time (viscosity stability, insoluble matter resistance and ejection stability in inkjet printing); a transparent electrode excellent in expansion/contraction stability, transparency and conductivity obtained by the method; and an organic electronic device having an excellent rectification ratio and being free from current leakage obtained by using the transparent electrode.

The present inventors have earnestly investigated the above problems and found out that the transparent electrode manufacturing method using a transparent conductive layer forming application liquid excellent in stability over time (viscosity stability, insoluble matter resistance and ejection stability in inkjet printing) can be realized by a method including: a step of forming a thin metal wire on a transparent substrate; and a step of forming a transparent conductive layer on the transparent substrate and the thin metal wire, wherein the step of forming the transparent conductive layer is a step of forming the transparent conductive layer by applying a transparent conductive layer forming application liquid onto the transparent substrate and the thin metal wire by printing, and the transparent conductive layer is formed by using the transparent conductive layer forming application liquid containing 1) a conductive polymer, 2) a water-soluble binder having a specific structural unit, 3) a polar solvent having a specific log P value, and 4) a glycol ether of a specific content. Thus, the present inventors have reached disclosed embodiments of the invention.

That is, embodiments of the invention include the following.

(Claim 1)

1. A transparent electrode manufacturing method for manufacturing a transparent electrode by forming a thin metal wire and a transparent conductive layer on a transparent substrate, the method including: a step of forming the thin metal wire on the transparent substrate; and a step of forming the transparent conductive layer on the transparent substrate and the thin metal wire, wherein the step of forming the transparent conductive layer is a step of forming the transparent conductive layer by applying a transparent conductive layer forming application liquid onto the transparent substrate and the thin metal wire by printing, and the transparent conductive layer forming application liquid is composed of 1) a conductive polymer, 2) a water-soluble binder having a structural unit represented by the following general formula (I), 3) a polar solvent having a log P value of −1.50 to −0.45, and 4) 5.0 to 25 mass % of a glycol ether.

[Chem. 1] (Claim 1), (Claim 2)

General Formula (I)

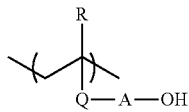

In the general formula (I), R represents a hydrogen atom or a methyl group; Q represents C(=O)O or C(=O)NRa, and Ra represents an atomic group to form a morpholine group with a hydrogen atom, an alkyl group or a nitrogen atom; and A represents a substituted or non-substituted alkylene group or $(CH_2CHRbO)_x—(CH_2CHRb)$, Rb represents a hydrogen atom or an alkyl group, and x represents a number of 0 to 100 as an average number of repeating units.

2. The transparent electrode manufacturing method according to the above 1, wherein the polar solvent is a propylene glycol or a dimethyl sulfoxide.

(Claim 3)

3. The transparent electrode manufacturing method according to the above 1 or 2, wherein the glycol ether is an ethylene glycol monoalkyl ether or a propylene glycol monoalkyl ether.

(Claim 4)

4. The transparent electrode manufacturing method according to any of the above 1 to 3, wherein a content of the polar solvent in the transparent conductive layer forming application liquid is 8.0 to 25 mass % in the total mass of the transparent conductive layer forming application liquid.

(Claim 5)

5. The transparent electrode manufacturing method according to any of the above 1 to 4, wherein the conductive polymer has a π-conjugated conductive polymer component A and a polyanion component B, and a mass ratio (A:B) of a solid content of the π-conjugated conductive polymer component A to a solid content of the polyanion component B in the conductive polymer is 1:1 to 1:10.

(Claim 6)

6. The transparent electrode manufacturing method according to the above 5, wherein the polyanion component B constituting the conductive polymer has a fluorine atom.

(Claim 7)

7. The transparent electrode manufacturing method according to any of the above 1 to 6, wherein the printing used for forming the transparent conductive layer is inkjet printing.

(Claim 8)

8. The transparent electrode manufacturing method according to any of the above 1 to 7, wherein the thin metal wire is formed with a stripe pattern having a wire width of 10 to 100 μm, a wire interval of 0.5 to 4.0 mm and a wire height of 0.1 to 2.0 μm.

(Claim 9)

9. The transparent electrode manufacturing method according to any of the above 1 to 7, wherein the thin metal wire is formed with a lattice pattern having a wire width of 10 to 100 μm, a wire interval of 0.5 to 4.0 mm and a wire height of 0.1 to 2.0 μm.

(Claim 10)

10. The transparent electrode manufacturing method according to any of the above 1 to 9, wherein the thin metal wire is formed by printing.

(Claim 11)

11. The transparent electrode manufacturing method according to any of the above 1 to 10, wherein the transparent substrate is a glass substrate.

(Claim 12)

12. A transparent electrode manufactured by the transparent electrode manufacturing method according to any of the above 1 to 11.

(Claim 13)

13. An organic electronic device including: the transparent electrode according to the above 12; a second electrode disposed opposite to the transparent electrode; and an organic functional layer disposed between the transparent electrode and the second electrode.

(Claim 14)

14. The organic electronic device according to the above 13, wherein the organic electronic device is an organic electroluminescent device.

That is, the present inventors have investigated the above problems in detail and conceived embodiments of the invention through the process below.

Usually, when a transparent conductive layer forming application liquid containing a conductive polymer and a water-soluble binder containing a structural unit having a hydroxyl group (OH) in a repeating unit is used in forming a transparent conductive layer, a problem arises that the viscosity of the prepared transparent conductive layer forming application liquid increases with the lapse of time. It has been surmised that this is a result of breakdown of a stable dispersion state of the conductive polymer and the water-soluble by interaction between the conductive polymer and the water-soluble binder.

Then, the present inventors have earnestly investigated the problem and found out that a transparent conductive layer forming application liquid excellent in stability over time without viscosity increase over time can be obtained by making a polar solvent having a log P value of −1.50 to −0.45 exist in the transparent conductive layer forming application liquid, which contains the conductive polymer and the water-soluble binder. However, when the polar solvent having a log P value of −1.50 to −0.45 is used in the transparent conductive layer forming application liquid, a problem arises that a transparent conductive layer is wet-spread at a drying step after the transparent conductive layer is formed on a transparent substrate and a thin metal wire. Then, it has been found out that, even after passing through the drying step, the formed transparent conductive layer, namely, the coated film, can keep its shape immediately after the application by making the transparent conductive layer forming application liquid further contain a glycol ether within a range from 5.0 to 25 mass %. It has also been found out that an organic electronic device having an excellent rectification ratio and being free from current leakage can be manufactured by forming a transparent conductive layer on a thin metal wire which is formed on a transparent substrate by using a transparent conductive layer forming application liquid having the structure specified by one or more embodiments of the invention.

In accordance with one or more embodiments of the invention, there can be provided: a transparent electrode manufacturing method using a transparent conductive layer forming application liquid excellent in stability over time (viscosity stability, insoluble matter resistance and ejection stability in inkjet printing); a transparent electrode excellent in expansion/contraction stability, transparency and conductivity obtained by the method; and an organic electronic device having an excellent rectification ratio and being free from current leakage obtained by using the transparent electrode.

DETAILED DESCRIPTION

Figure 1:
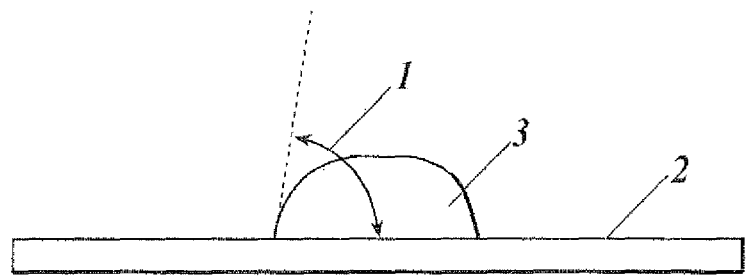
FIG. 1 is a schematic view for roughly explaining a taper angle formed by a transparent substrate and a thin metal wire in accordance with one or more embodiments of the invention.

In accordance with one or more embodiments of the invention, a transparent electrode manufacturing method is a transparent electrode manufacturing method for manufacturing a transparent electrode by forming a thin metal wire and a transparent conductive layer on a transparent substrate, the method including a step of forming the thin metal wire on the transparent substrate and a step of forming the transparent conductive layer on the transparent substrate and the thin metal wire, wherein the step of forming the transparent conductive layer is a step of forming the transparent conductive layer by applying a transparent conductive layer forming application liquid onto the transparent substrate and the thin metal wire by printing, and the transparent conductive layer forming application liquid is composed of 1) a conductive polymer, 2) a water-soluble binder having a structural unit represented by the above General Formula (I), 3) a polar solvent having a log P value of −1.50 to −0.45, and 4) 5.0 to 25 mass % of a glycol ether, so that a transparent electrode manufacturing method using a transparent conductive layer forming application liquid excellent in stability over time (viscosity stability, insoluble matter resistance and ejection stability in inkjet printing) can be realized. The above described feature is a technical feature common to one or more embodiments of the invention.

In accordance with one or more embodiments of the invention, in order to well demonstrate the effects aimed by the embodiments, the polar solvent may be a propylene glycol or a dimethyl sulfoxide, and the glycol ether be an ethylene glycol monoalkyl ether or a propylene glycol monoalkyl ether, the polar solvent and the glycol ether constituting the transparent conductive layer forming application liquid, so that the transparent conductive layer forming application liquid more excellent in stability over time (viscosity stability, insoluble matter resistance and ejection stability in inkjet printing) can be obtained. Further, the content of the polar solvent in the transparent conductive layer forming application liquid may be 8.0 to 25 mass % in the total mass of the transparent conductive layer forming application liquid, so that the transparent conductive layer forming application liquid far more excellent in stability over time (viscosity stability, insoluble matter resistance and ejection stability in inkjet printing) can be obtained. Further, the conductive polymer constituting the transparent conductive layer forming application liquid may have a π-conjugated conductive polymer component A and a polyanion component B, and a ratio (A:B) of a solid content of the π-conjugated conductive polymer component A to a solid content of the polyanion component B in the conductive polymer be 1:1 to 1:10. Further, it is preferable that the polyanion component B constituting the conductive polymer have a fluorine atom. Further, it is preferable that the printing used for forming the transparent conductive layer be inkjet printing, so that the transparent conductive layer which is fine can be formed. Further, it is preferable that the formed thin metal wire take on a stripe pattern having a wire width of 10 to 100 m, a wire interval of 0.5 to 4.0 mm and a wire height of 0.1 to 2.0 μm, or the formed thin metal wire take on a lattice pattern having a wire width of 10 to 100 m, a wire interval of 0.5 to 4.0 mm and a wire height of 0.1 to 2.0 μm, so that an organic electroluminescent device having an excellent rectification ratio and being free from current leakage can be manufactured.

Further, the thin metal wire may be formed by printing, and/or the transparent substrate be a glass substrate.

Hereinafter, embodiments of the invention, its components, and forms/modes for carrying out embodiments of the invention are detailed. Note that in the following description, "-(to)" between values is used to mean that the values before and after the sign are inclusive as the lower limit and the upper limit.

Hereinafter, in accordance with one or more embodiments of the invention the structure of a transparent electrode, a manufacturing method therefor and an organic electronic device using the transparent electrode are detailed with explanation of the drawings.

<<Transparent Electrode>>

In accordance with one or more embodiments of the invention, a transparent electrode manufacturing method is mainly characterized by a step of forming a thin metal wire on a transparent substrate and a step of forming a transparent conductive layer on the transparent substrate and the thin metal wire, through which a transparent electrode is formed.

The transparent conductive layer of one or more embodiments is formed by applying a transparent conductive layer forming application liquid having a specific structure described below onto the transparent substrate and the thin metal wire by printing.

[Transparent Substrate]

In accordance with one or more embodiments of the invention, in the transparent substrate which constitutes the transparent electrode, the "transparent" means that the total luminous transmittance in the visible wavelength region measured by a method in conformity with JIS K 7361-1: 1997 (Plastics-Determination of the Total Luminous Transmittance of Transparent Materials) is 70% or more.

A material usable for the transparent substrate of embodiments of the invention is not particularly limited as long as it is a transparent material, and can be suitably selected for use from publicly known materials used for organic electronic devices.

Examples of the transparent substrate usable in one or more embodiments of the invention include a transparent resin substrate and a glass substrate. In particular, in the case where the transparent electrode is used in an organic electronic device, the performance of which is easily degraded by water or oxygen, a glass substrate may be used in terms of a barrier property. Further, in terms of hardness, light weight, flexibility and suitability for continuous production by roll-to-roll, a thin-film glass substrate having flexibility may also be used. Use of such a substrate excellent in flexibility enables manufacture of a bendable organic electronic device.

The thin-film glass substrate is, for example, a thin-film glass having a thickness of 120 μm or less, preferably a thin-film glass having a thickness of 30 to 100 μm.

The "having flexibility" in embodiments of the invention means that a glass substrate is bendable to a radius of curvature of 100 mm without scratch or flaw.

A method for manufacturing such a glass substrate and the type of the glass substrate are not particularly limited, and exemplified by an alkali-free glass which is generally used by preference for an organic electronic device.

The transparent substrate can be surface-treated or provided with an easy adhesion layer in order to improve adhesiveness to the transparent conductive layer formed on the upper side of the transparent substrate.

Publicly known technologies are usable for the surface treatment and the easy adhesion layer.

Examples of the surface treatment include surface activation treatment such as corona ejection treatment, flame treatment, ultraviolet treatment, high frequency treatment, glow ejection treatment, activated plasma treatment and laser treatment.

Examples of a material for the easy adhesion layer include polyester, polyamide, polyurethane, vinyl copolymers, butadiene copolymers, acryl copolymers, vinylidene copolymers and epoxy copolymers. The easy adhesion layer may be composed of a single layer or, in order to improve adhesiveness, may be composed of two or more layers.

In the case where the transparent substrate is a resin substrate, a barrier coating layer may be formed in advance or a hard coating layer may be formed in advance, as needed.

As the barrier coating layer, on the front side or the back side of the resin substrate, a coating composed of an inorganic matter or an organic matter or a hybrid coating composed of these may be formed.

It is preferable that the transparent substrate have a barrier property of a water vapor permeability (at 25±0.5° C. and a relative humidity of 90±2% RH) of $1 \times 10^{-3}$ g/(m$^2$·24 h) or less determined by a method in conformity with JIS K 7129-1992. It is far preferable that the transparent substrate have an oxygen permeability of $1 \times 10^{-3}$ ml/(m$^2$·24 h·atm) or less determined by a method in conformity with JIS K 7126-1987 and a water vapor permeability (at 25±0.5° C. and a relative humidity of 90±2% RH) of $1 \times 10^{-3}$ g/(m$^2$·24 h) or less.

As a material which is used to form the barrier coating layer on the transparent substrate, any material can be used as long as it is impermeable to factors such as moisture and oxygen which cause degradation of an organic electronic device. Usable examples thereof include inorganic materials such as silicon oxide, silicon dioxide and silicon nitride.

In order to reduce fragility of the barrier coating layer, it is far preferable that the barrier coating layer have a multi-layer structure of an inorganic layer and an organic layer composed of an organic material. Although the stacking order of the inorganic layer and the organic layer is not particularly limited, it is preferable that these layers be alternately stacked multiple times.

[Thin Metal Wire]

In accordance with one or more embodiments of the invention, the thin metal wire is a thin wire structure composed of a metal material and is a layer formed in a pattern to have an open part on the transparent substrate. The open part is a part having no thin metal wire on the transparent substrate and is a translucent part of the metal pattern.

The pattern of the thin metal wire is not particularly limited and therefore may be striped (parallel lines), latticed, honeycomb or a random network, but in terms of transparency, preferably striped or latticed, in particular striped.

In accordance with one or more embodiments of the transparent electrode, a ratio of the open part to the entire surface of the sheet electrode, namely, an open area ratio, is preferably 80% or more in terms of transparency.

For example, in the case where the thin metal wire is striped, the open area ratio of a stripe pattern having a wire width of 100 μm and a wire interval of 1 mm is approximately 90%.

For the thin metal wire, a stripe pattern having a wire width of 10 to 100 μm, a wire interval of 0.5 to 4.0 mm, and a wire height of 0.1 to 2.0 μm is preferable, and also a lattice pattern having a wire width of 10 to 100 μm, a wire interval of 0.5 to 4.0 mm and a wire height of 0.1 to 2.0 μm is preferable.

In accordance with one or more embodiments of the invention, the wire width can be within a range from 10 to 200 µm, but as described above, the wire width is preferably within a range from 10 to 100 µm because when the wire width of a thin wire(s) is 10 µm or more, a desired level of conductivity can be obtained, whereas when the wire width thereof is 100 µm or less, a sufficient level of transparency can be obtained.

As described above, in a stripe or lattice pattern of the thin metal wire, the interval between thin wires is preferably within a range from 0.5 to 4.0 mm.

In accordance with one or more embodiments of the invention, the height (thickness) of the thin metal wire can be within a range from 0.1 to 5.0 µm, but as described above, the height (thickness) of the thin metal wire is preferably within a range from 0.1 to 2.0 µm because when the height of a thin wire(s) is 0.1 µm or more, a desired level of conductivity can be obtained, whereas when the height thereof is 2.0 µm or less, current leakage can be well prevented, the rectification ratio can be further improved, and the thickness distribution of a transparent conductive layer to be stacked can be uniform.

A method for forming the striped, latticed or honeycomb thin metal wire is not particularly limited and therefore can be suitably selected for use from publicly known methods.

Usable examples of the specific method for forming the thin metal wire include methods making use of photolithography, silver halide photographic technology and printing. In particular, in the case where the transparent electrode is used in an organic electronic device, it is preferable to form the thin metal wire by printing in order to further improve the rectification ratio because the thin metal wire formed by printing has a smaller taper angle and a narrower thickness distribution than the thin metal wire formed by photolithography or silver halide photographic technology.

The taper angle of the thin metal wire in accordance with one or more embodiments of the invention is described with reference to the drawings.

FIG. 1 is a cross-sectional view for schematically illustrating the taper angle formed by the transparent substrate and the thin metal wire in accordance with one or more embodiments of the invention.

As shown in FIG. 1, a taper angle 1 in accordance with one or more embodiments of the invention means an interior angle formed by a transparent substrate 2 and an edge of a thin metal wire 3. The taper angle 1 is measurable by cutting the transparent substrate 2 and the thin metal wire 3 in a section and making an observation under a SEM (scanning electron microscope).

In accordance with one or more embodiments of the invention, the photolithography usable for forming the thin metal wire is a method as follows; a matter surface coated with a photosensitive (photo-curable) resin is exposed in a pattern (called pattern exposure or image-like exposure) through a photomask so that the pattern composed of an exposed part (cured part) and a non-exposed part (uncured part) is formed, and then the unnecessary part (uncured part) is removed by image development so that the pattern is formed of the cured part. More specifically, after (i) a conductive layer is formed over the entire substrate by one or two or more physical- or chemical-formation methods such as printing, vapor deposition, sputtering and plating, or after (ii) a metal foil is stacked on the substrate with an adhesive, it is etched by the publicly known photolithography, whereby the thin metal wire is processed to be striped, latticed, or honeycomb, whichever desired.

The method making use of silver halide photographic technology can be implemented, for example, with reference to Paragraphs [0076] to [0112] and Examples of Japanese Patent Application Laid-Open Publication No. 2009-140750.

The publicly known printing is a method of forming a pattern by printing with a thin metal wire forming application liquid which contains metal particles.

The thin metal wire forming application liquid which contains metal particles is a metal particle dispersion liquid which contains metal particles described below.

The metal particle dispersion liquid contains metal particles in a solvent such as water or alcohol and may also contain, as needed, a binder, a dispersion agent for dispersing metal, and the like.

With the metal particle dispersion liquid, a metal pattern can be formed by printing such as gravure printing, flexographic printing, screen printing and inkjet printing.

As each of these types of printing, a method generally used for forming an electrode pattern is applicable to embodiments of the invention. As specific examples, there are methods described in: Japanese Patent Application Laid-Open Publication Nos. 2009-295980, 2009-259826, 2009-96189, 2009-90662 and so forth about gravure printing; Japanese Patent Application Laid-Open Publication Nos. 2004-268319, 2003-168560 and so forth about flexographic printing; and Japanese Patent Application Laid-Open Publication Nos. 2010-34161, 2010-10245, 2009-302345 and so forth about screen printing.

The metal particles having an average particle diameter of the atomic scale to 1000 nm is preferably usable.

In particular, in one or more embodiments of the invention, the average particle diameter thereof is preferably within a range from 3.0 to 300 nm and far preferably within a range from 5.0 to 100 nm.

In particular, in the case where a resin substrate or a resin film is used as the transparent substrate, among the above mentioned ones, silver nanoparticles having an average particle diameter of 3.0 to 100 nm are preferable because high conductivity can be obtained with them at a low heating temperature.

The average particle diameter is simply and easily measurable with a commercially available particle size measurement device by light scattering or the like. In accordance with embodiments of the invention, it is a value determined with Zetasizer 1000 (manufactured by Malvern Instruments Ltd.) by the laser Doppler method at a liquid temperature of 25° C. with a sample dilute solution of 1.0 ml.

The metal particle dispersion liquid may be subjected to heat treatment after a pattern is formed. This may be preferable because metal particles thereof are well fused with each other thereby, and the conductivity of the thin metal wire increases.

For metal particles, the heating temperature is preferably within a range from 100 to 500° C., and the time is, although depending on the temperature and the size of metal particles to use, preferably 10 seconds or more and 30 minutes or less and, in terms of productivity, preferably 10 seconds or more and 15 minutes or less and far preferably 10 seconds or more and 5 minutes or less.

In the case where a resin substrate or a resin film is used as the transparent substrate, it is preferable to suitably select, from a range from 100 to 250° C., a temperature for heating which does not damage the substrate.

A method for the heat treatment is not particularly limited, and a publicly known heating method can be used. Examples of modes of the heat treatment include but are not limited to heating with a heater or an IR heater and drying by heating under reduced pressure. In the case where a resin substrate or a resin film is used as the transparent substrate, it may be preferable to use plasma treatment, xenon flashtube treatment or the like in addition to the heat treatment so as to be able to reduce resistance under a low temperature environment.

As a method for forming the random network pattern, there is an applicable method described, for example, in Published Japanese Translation of PCT International Publication for Patent Application No. 2005-530005, according to which a disordered network structure of conductive fine particles is spontaneously formed by applying and drying a liquid containing metal particles described therein.

The metal used for the thin metal wire is not particularly limited as long as it has excellent conductivity. Examples thereof include metals, such as gold, silver, copper, iron, cobalt, nickel and chromium, and alloys.

In terms of conductivity, silver or copper is preferable. Silver or copper may be used alone. Alternatively, they may be used in combination, for example, in the form of an alloy of silver and copper or one of them being plated with the other.

Surface resistivity of the thin-wire part of the thin metal wire is preferably 100Ω/□ or less, far preferably 10Ω/□ or less, and, for the area increase, far preferably 5Ω/□ or less. The surface resistivity is measurable, for example, in conformity with JIS K6911, ASTM D257 or the like and is simply and easily measurable with a commercially available surface resistivity meter.

[Transparent Conductive Layer]

In accordance with one or more embodiments of the invention, the transparent conductive layer may be a transparent conductive layer containing a conductive polymer and a water-soluble binder having a structural unit represented by General Formula (I) (also simply referred to as "water-soluble binder" hereinafter). In accordance with one or more embodiments of the invention, the transparent conductive layer contains the water-soluble binder having a structural unit represented by General Formula (I), whereby the conductivity of the conductive polymer is enhanced, and consequently, high conductivity and high transparency which cannot be obtained with the conductive polymer alone can be obtained.

The transparent conductive layer is formed with a transparent conductive layer forming application liquid containing, in addition to the above described 1) conductive polymer and 2) water-soluble binder, 3) polar solvent having a log P value of −1.50 to −0.45 and 4) 5.0 to 25 mass % of glycol ether by applying, and drying thereafter, the transparent conductive layer forming application liquid onto the transparent substrate on which the thin metal wire is formed. By forming the transparent electrode having a multilayer structure composed of the thin metal wire and the transparent conductive layer, high conductivity which cannot be achieved with the thin metal wire or the conductive polymer layer alone can be obtained uniformly in the electrode surface.

In one or more embodiments of the transparent conductive layer, a ratio of 2) water-soluble binder to 1) conductive polymer is, to 100 parts by mass of the conductive polymer, preferably within a range from 30 to 900 parts by mass of the water-soluble binder and, in terms of current leakage prevention, the conductivity enhancement effect of the water-soluble binder, and transparency, far preferably 100 parts by mass or more of the water-soluble binder.

The dry thickness of the transparent conductive layer is, although suitably selectable considering transmittance of the transparent conductive layer and sheet resistivity required based on the size of the open part of the thin metal wire, preferably within a range from 30 to 2000 nm. The thickness is far preferably 200 nm or more in terms of conductivity and far preferably 1000 nm or less in terms of transparency.

After the transparent conductive layer forming application liquid is applied, dry treatment can be carried out as needed. Although conditions of the dry treatment are not particularly limited, the dry treatment is carried out preferably within a temperature range in which the transparent substrate and the transparent conductive layer are not damaged. Further, by carrying out heat treatment, the solvents in the application liquid are evaporated, and a condensation reaction of water-soluble binders or of the water-soluble binder(s) and the conductive polymer of the transparent conductive layer can proceed and be completed. This significantly improves cleaning resistance and solvent resistance of the electrode and also improves performance of an organic element device. In particular, in an organic EL device, effects such as decrease in driving voltage and extension of lifetime are obtained. The step of drying and the step of heat treatment may be one step or individual steps which are carried out separately. In the case of individual steps which are carried out separately, the drying step and the heat treatment step may be continuous steps or have a temporary stop between these treatment steps.

Although conditions of the drying step and the heat treatment step are not particularly limited, for the drying, as a condition for rapid evaporation of the solvents, for example, the temperature may be 80° C. or more, and its upper limit may be about 300° C. or less as a temperature up to which the transparent conductive layer is not damaged. The time is preferably about ten seconds to ten minutes. Further, the heat treatment is carried out preferably within a temperature range from 150 to 300° C. The temperature being 150° C. or more can complete evaporation of the solvents in the application liquid and makes the reaction promotion effect great, whereas the temperature being 300° C. or less can prevent both pyrolysis of the conductive polymer and increase by heat in resistance of the transparent conductive layer. The heat treatment time is preferably one minute or more. Although the upper limit of the treatment time is not particularly limited, the treatment time is preferably 24 hours or less in terms of productivity. However, in the case where the heat treatment temperature exceeds 200° C., the treatment time may be within 30 minutes. The heat treatment may be carried out online or offline after the transparent conductive layer is applied and dried. In the case where the heat treatment is carried out offline, the heat treatment may be carried out under further reduced pressure because this leads to acceleration of drying moisture. Examples of the method for the heat treatment include heating with a heater or a IR heater, heating under reduced pressure, electromagnetic induction heating, microwave heating, laser heating and plasma heating. In terms of easiness of temperature control and humidity control, heating with a heater may be preferable.

In one or more embodiments of the invention, use of an acid catalyst can promote and complete the condensation reaction of water-soluble binders or of the water-soluble binder(s) and the conductive polymer of the transparent conductive layer. Usable examples of the acid catalyst include hydrochloric acid, sulfuric acid and ammonium sulfate. Further, when a sulfo group-containing polyanion is used as the polyanion which is used as a dopant for the conductive polymer, the polyanion can be used as both a dopant and a catalyst. Further, it is preferable to both use the acid catalyst and carry out the above described heat treatment because this leads to decrease in the treatment time.

[Transparent Conductive Layer Forming Application Liquid]

In accordance with one or more embodiments of the invention, the transparent conductive layer forming application liquid used for forming the transparent conductive layer may contain, in addition to 1) conductive polymer and 2) water-soluble binder having a structural unit represented by General Formula (I), at least 3) polar solvent having a log P value of −1.50 to −0.45 and 4) 5.0 to 25 mass % of glycol ether, which is a main feature in structure. The transparent conductive layer forming application liquid may be an application liquid which prevents its viscosity from increasing, which occurs over time, and is excellent in stability over time.

In accordance with one or more embodiments of the invention, use of the transparent conductive layer forming application liquid, which has such properties, in inkjet printing as a formation method for a transparent conductive layer can realize stable ejection thereof from an inkjet head(s). Further, when the transparent conductive layer forming application liquid is applied, and dried thereafter, onto the transparent substrate and the thin metal wire, the formed transparent conductive film is not expanded or contracted, and accordingly patterning accuracy is excellent, and the thin metal wire can be completely covered therewith without being exposed therefrom.

(log P Value)

The polar solvent in one or more embodiments of the invention is a high hydrophilic solvent and has a log P value of −1.50 or more and −0.45 or less.

The log P value in embodiments of the invention is a logarithm of a partition coefficient (Po/w) of a compound in a two-phase solvent of 1-octanol/water and is a type of an index value indicating degree of hydrophobicity or hydrophilicity of the compound.

The partition coefficient (log P value) of 1-octanol/water is measurable by the shake-flask method described in JIS Z7260-107 (2000), in general. The partition coefficient (log P value) of I-octanol/water can also be estimated by a computational scientific method or an empirical method instead of the actual measurement. As the computational method, it is known to use, for example, Crippen's fragmentation (J. Chem. Inf. Comput. Sci., 27, 21 (1987)), Viswanadhan's fragmentation (J. Chem. Inf. Comput. Sci., 29, 163 (1989)) and Broto's fragmentation (Eur. J. Med. Chem. Chim. Theor., 19, 71 (1984)). In accordance with one or more embodiments of the present invention, Crippen's fragmentation (J. Chem. Inf. Comput. Sci., 27, 21 (1987)) can be used.

As a method or software used for calculating the log P value, a publicly known one can be used. In one or more embodiments of the invention, the system, ChemBioDraw, manufactured by CambridgeSoft is used to calculate the log P value.

In the case where the log P value of a certain compound differs between when obtained by measurement and when obtained by calculation, whether or not the compound is within the range of one or more embodiments of the invention is determined by the log P value obtained with ChemBioDraw.

Although detailed mechanism of how the polar solvent having a log P value of −1.50 to −0.45 in the transparent conductive layer forming application liquid produces its effects has been unknown, it is considered that the transparent conductive layer forming application liquid containing the polar solvent having a log P value of −1.50 to −0.45 increased dispersibility of both components, namely, the conductive polymer and the water-soluble binder, and accordingly prevented the viscosity of the transparent conductive layer forming application liquid from increasing, which may occur when the application liquid stagnates for many hours. In addition, use of the polar solvent having a log P value of −1.50 to −0.45 can prevent a gel insoluble matter from being generated, which easily occurs when a polar solvent having a log P value larger than −0.45, such as a glycol ether, is used in the transparent conductive layer forming application liquid. Also, it is considered that the transparent conductive layer forming application liquid containing the glycol ether of 5.0 to 25 mass % adjusted surface tension of the transparent conductive layer forming application liquid and accordingly prevented the coated film from being expanded or contracted, which is caused by the coated film being dried.

(Polar Solvent)

The polar solvent of one or more embodiments of the invention has a log P value of −1.50 to −0.45. Use of the polar solvent having a log P value of −1.50 to −0.45 can demonstrate, as described above, the viscosity stability of the transparent conductive layer forming application liquid even when the application liquid stagnates for many hours and the effect of preventing a gel insoluble matter from being generated.

Further, it is preferable that the content of the polar solvent, which has a log P value of −1.50 to −0.45, of one or more embodiments of the invention be within a range from 8.0 to 25 mass in the transparent conductive layer forming application liquid because this can further demonstrate the viscosity stability of the transparent conductive layer forming application liquid even when the application liquid stagnates for many hours and the effect of preventing a gel insoluble matter from being generated.

Further, in accordance with one or more embodiments of the invention, in the transparent conductive layer forming application liquid, the content of the glycol ether is within a range from 5.0 to 25 mass %. The content of the glycol ether being 5 mass % or more can demonstrate an effect of reducing the surface tension and prevent the transparent conductive layer forming application liquid from being wet-spread, whereas the content thereof being 25 mass % or less does not affect the effects of the polar solvent and can prevent the viscosity of the transparent conductive layer forming application liquid from increasing and a gel insoluble matter from being generated. Further, the content thereof described above does not reduce the surface tension too much and can prevent the transparent conductive layer as the coated film from being contracted at the drying step of the transparent conductive layer forming application liquid. The glycol ether is within a range from 5.0 to 25 mass in the transparent conductive layer forming application liquid, preferably within a range from 8.0 to 20 mass % therein.

The polar solvent of one or more embodiments of the invention having a log P value of −1.50 to −0.45 is not particularly limited. Examples thereof include ethylene glycol (log P=−0.79), diethylene glycol (log P=−0.95), triethylene glycol (log P=−1.10), diethylene glycol monomethyl ether (log P=−0.58), triethylene glycol monomethyl ether (log P=−0.74), propylene glycol (log P=−0.47), 1,3-propanediol (log P=−0.68) and dimethyl sulfoxide (log P=−1.49). In particular, in the case where inkjet printing is used as the printing for the transparent conductive layer forming application liquid, an ethylene glycol, a propylene glycol and a dimethyl sulfoxide are preferable in terms of ejection stability from a nozzle part, a propylene glycol and a dimethyl sulfoxide are far preferable in terms of the rectification ratio of an organic electronic device, and a dimethyl sulfoxide is particularly preferable in terms of stability in stagnation (stability over time) of a transparent conductive layer forming application liquid.

(Glycol Ether)

Examples of the glycol ether usable in one or more embodiments of the invention include ethylene glycol alkyl ethers, diethylene glycol alkyl ethers, triethylene glycol alkyl ethers, propylene glycol alkyl ethers, dipropylene glycol alkyl ethers and tripropylene glycol alkyl ethers. In terms of viscosity, surface tension and stability in stagnation of a transparent conductive layer forming application liquid, ethylene glycol monoalkyl ethers and propylene glycol monoalkyl ethers are preferable.

Examples of the ethylene glycol monoalkyl ethers and the propylene glycol monoalkyl ethers include ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether and propylene glycol monobutyl ether. In particular, ethylene glycol monobutyl ether and propylene glycol monopropyl ether are preferable.

(Additive for Forming Transparent Conductive Layer)

In accordance with one or more embodiments of the invention, the transparent conductive layer forming application liquid may further contain another transparent polymer, an additive, a crosslinking agent and the like within a range where the conductivity, transparency and smoothness of the transparent conductive layer of one or more embodiments of the invention are simultaneously satisfied.

The transparent polymer to be used is selectable from a wide variety of natural polymer resins and synthetic polymer resins, and a water-soluble polymer and an aqueous polymer emulsion are particularly preferable.

Examples of the water-soluble polymer include: natural polymers such as starch, gelatin and agar; semi-synthetic polymer cellulose derivatives such as hydroxypropyl methylcellulose, carboxymethyl cellulose and hydroxyethyl cellulose; and synthetic polymers such as polyvinyl alcohol, polyacrylic acid polymer, poly acrylic amide, polyethylene oxide and polyvinyl pyrrolidone.

Examples of the aqueous polymer emulsion include: acrylic resins (for example, silicone modified acrylic resin, fluorine modified acrylic resin, urethane modified acrylic resin and epoxy modified acrylic resin), polyester resins, urethane resins and vinyl acetate resins.

Usable examples of the synthetic polymer resins include: transparent thermoplastic resins (for example, polyvinyl chloride, vinyl chloride-vinyl acetate copolymer, polymethyl methacrylate, nitro cellulose, chlorinated polyethylene, chlorinated polypropylene and vinylidene fluoride); and transparent active-ray curable resins cured with heat, light, electron beam and radiation (for example, melamine acrylate, urethane acrylate, epoxy resin, polyimide resin and silicone resin such as acrylic modified silicate).

Examples of the crosslinking agent for the water-soluble binder include oxazoline crosslinking agents, carbodiimide crosslinking agents, isocyanate crosslinking agents, epoxy crosslinking agents, melamine crosslinking agents and formaldehyde crosslinking agents. One of these may be used alone or a plurality of these may be used in combination.

(Conductive Polymer)

As the conductive polymer which constitutes the transparent conductive layer forming application liquid of one or more embodiments of the invention, a conductive polymer having a π-conjugated conductive polymer component A and a polyanion component B is preferably usable.

This sort of conductive polymer can be easily produced by subjecting a precursor monomer, described below, for forming the π-conjugated conductive polymer component A to chemical oxidative polymerization under the presence of an appropriate oxidizer, an appropriate oxidation catalyst and the polyanion component B described below.

<π-Conjugated Conductive Polymer Component A>

Usable examples of the π-conjugated conductive polymer component A include chain conductive polymers such as polythiophenes (including simple polythiophene, the same applies to the following), polypyrrols, polyindoles, polycarbazoles, polyanilines, polyacetylenes, polyfurans, polyparaphenylene vinylenes, polyazulenes, polyparaphenylenes, polyparaphenylene sulfides, polyisothianaphthenes and polythiazyls.

Among them, in terms of conductivity, transparency, stability and the like, polythiophenes and polyanilines are preferable. More specifically, polyethylene dioxythiophene is the most preferable.

<Precursor Monomer for π-Conjugated Conductive Polymer Component A>

The precursor monomer has a π-conjugated system in the molecule, and hence when the precursor monomer is polymerized by the action of an appropriate oxidizer, the π-conjugated system is formed in the principal chain.

Examples of the precursor monomer include pyrroles and derivatives thereof, thiophenes and derivatives thereof, and anilines and derivatives thereof.

Specific examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylene dioxythiophene, 3,4-propylene dioxythiophene, 3,4-butene dioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-aniline sulfonic acid and 3-aniline sulfonic acid.

<Polyanion Component B>

The polyanion component B is an oligomer or polymer having a plurality of anionic groups.

The polyanion component B used by preference is exemplified by: substituted or non-substituted polyalkylene; substituted or non-substituted polyalkenylene; substituted or non-substituted polyimide; substituted or non-substituted polyamide; substituted or non-substituted polyester; and copolymers thereof, and is composed of a structural unit having an anionic group and a structural unit having no anionic group.

The polyanion component B is a solubilizing polymer to solubilize the π-conjugated conductive polymer component A in a solvent.

The anionic group of the polyanion component B functions as a dopant for the π-conjugated conductive polymer component A and improves conductivity and heat resistance of the π-conjugated conductive polymer component A.

The anionic group of the polyanion component B is any functional group with which the π-conjugated conductive polymer component A can be doped by chemical oxidation. In particular, a monosubstituted sulfuric acid ester group, a monosubstituted phosphoric acid ester group, a phosphoric acid group, a carboxyl group, a sulfo group and the like are preferable in terms of easiness of manufacture and stability. A sulfo group, a monosubstituted sulfuric acid ester group and a carboxyl group are far preferable in terms of the doping effect of the functional group on the π-conjugated conductive polymer.

Specific examples of the polyanion component B include polyvinylsulfonic acid, polystyrenesulfonic acid, polyallylsulfonic acid, polyacrylic acid ethylsulfonic acid, polyacrylic acid butylsulfonic acid, poly-2-acrylamide-2-methylpropanesulfonic acid, polyisoprenesulfonic acid, polyvinylcarboxylic acid, polystyrenecarboxylic acid, polyallylcarboxylic acid, polyacrylcarboxylic acid, polymethacrylcarboxylic acid, poly-2-acrylamide-2-methylpropanecarboxylic acid, polyisoprenecarboxylic acid and polyacrylic acid. The polyanion component B may be a homopolymer of any of these or a copolymer composed of two or more types of these.

In one or more embodiments of the invention, it is preferable that the polyanion component B have a fluorine atom in the compound because this improves the rectification ratio when the transparent electrode of one or more embodiments of the invention is used in an organic electronic device.

Specific examples thereof include Nafion (manufactured by DuPont K.K.) containing a perfluorosulfonic acid group and Flemion (manufactured by Asahi Glass Co., Ltd.) composed of a perfluorovinyl ether containing a carboxylic acid group.

If, among them, the compound is the one having sulfonic acid, this is preferable because cleaning resistance and solvent resistance of the transparent conductive layer are significantly improved by heat treatment.

Among the above mentioned ones, polystyrenesulfonic acid, polyisoprenesulfonic acid, polyacrylic acid ethylsulfonic acid, and polyacrylic acid butylsulfonic acid are preferable. These polyanions each have high compatibility with the water-soluble binder described below and can further increase the conductivity of the conductive polymer to be obtained.

Degree of polymerization of the polyanion component B is preferably within a range from 10 to 100,000 in the number of monomer units and, in terms of solubility in a solvent and conductivity, far preferably within a range from 50 to 10,000 in the number of monomer units.

In accordance with one or more embodiments of the invention, a method for manufacturing the polyanion component B is exemplified by: a method of, using acid, direct introduction of an anionic group into a polymer having no anionic group; a method of, using a sulfonating agent, sulfonation of a polymer having no anionic group; and a method of polymerization of an anionic group-containing polymerizable monomer.

The method of polymerization of an anionic group-containing polymerizable monomer is exemplified by a method of subjecting, in a solvent, an anionic group-containing polymerizable monomer to oxidative polymerization or radical polymerization under the presence of an oxidizer or a polymerization catalyst.

More specifically, a predetermined amount of an anionic group-containing polymerizable monomer is dissolved into a solvent, the resulting product is kept at a constant temperature, and a solution in which a predetermined amount of an oxidizer or a polymerization catalyst is dissolved into a solvent in advance is added thereto and reacts therewith for a predetermined time. The polymer obtained by the reaction is adjusted to a certain concentration with a solvent. In this manufacturing method, the anionic group-containing polymerizable monomer may be copolymerized with a polymerizable monomer containing no anionic group.

The oxidizer, oxidizing catalyst and solvent used in polymerization of the anionic group-containing polymerizable monomer are the same as those used in polymerization of the precursor monomer for forming the π-conjugated conductive polymer component A.

If the obtained polymer is polyanionic salt, it is preferable to change polyanionic salt to polyanionic acid. A method for changing polyanionic salt to polyanionic acid is exemplified by: ion exchange with an ion exchange resin; dialysis; and ultrafiltration. Among them, ultrafiltration is preferable in terms of easiness of work.

A ratio (solid ratio, A:B) of the π-conjugated conductive polymer component A to the polyanion component B, which constitute the conductive polymer, by mass ratio (A:B) is, in terms of conductivity and dispersibility, preferably within a range from 1:1 to 1:10 and far preferably within a range from 1:2 to 1:8.

The oxidizer, which is used in subjecting the precursor monomer for forming the π-conjugated conductive polymer component A to chemical oxidative polymerization under the presence of the polyanion component B so as to obtain the conductive polymer of one or more embodiments of the invention, is any of oxidizers suitable for oxidative polymerization of pyrrole, the oxidizers being mentioned, for example, in J. Am. Soc., Vol. 85, p. 454 (1963). In practice, it is preferable to use an inexpensive and easily handleable oxidizer, and examples thereof include: iron (III) salts, such as $FeCl_3$, $Fe(ClO_4)_3$, and iron (III) salt of organic acid or inorganic acid containing organic residue; hydrogen peroxide; potassium dichromate; alkali persulfate (potassium persulfate and sodium persulfate, for example); ammonium; alkali perborate; potassium permanganate; and copper salt, such as copper tetrafluoroborate. In addition, air and oxygen under the presence of a catalytic amount of metal ion, such as iron ion, cobalt ion, nickel ion, molybdenum ion or vanadium ion, can be used as the oxidizer as needed. Use of persulfate or iron (III) salt of organic acid or inorganic acid containing organic residue is preferable because of the non-corrosiveness.

Examples of the iron (III) salt of inorganic acid containing organic residue include: iron (III) salts, namely, Fe (III) salts, of alkanol sulfuric acid half-ester having 1 to 20 carbon atoms, such as lauryl sulfate; alkylsulfonic acid having 1 to 20 carbon atoms, such as methane- or dodecanesulfonic acid; aliphatic carboxylic acid having 1 to 20 carbon atoms, such as 2-ethylhexylcarboxylic acid; aliphatic perfluorocarboxylic acid, such as trifluoroacetic acid and perfluorooctanoic acid; aliphatic dicarboxylic acid, such as oxalic acid; and in particular, alkyl, as needed, substituted aromatic sulfonic acid having 1 to 20 carbon atoms, such as benzenesulfonic acid, p-toluenesulfonic acid and dodecylbenzene sulfonic acid.

<Other Conductive Polymer Materials>

In accordance with one or more embodiments of the invention, the conductive polymer may be obtained as a commercially available product.

For example, a conductive polymer (abbreviated to "PEDOT-PSS" hereinafter) composed of poly(3,4-ethylene dioxythiophene) and polystyrenesulfonic acid is commercially available from Heraeus Holding as Clevios Series, from Aldrich as PEDOT-PASS 483095 and 560598, and from Nagase ChemteX Corporation as Denatron Series.

In addition, polyaniline is commercially available from Nissan Chemical Industries, Ltd. as ORMECON Series.

Any of these commercially available products may also be usable in one or more embodiments of the invention.

<Other Additives>

Examples of the additive include: a plasticizer; stabilizers such as an antioxidant and an anti-sulfurizing agent; a surfactant; a solubility enhancer; a polymerization inhibitor; and colorants such as a dye and a pigment. In order to increase workability such as an application property, a solvent(s) other than the polar solvent and the glycol ether of embodiments of the invention, such as water; an organic solvent which is exemplified by alcohols, glycols, cellosolves, ketones, esters, ethers, amides and hydrocarbons; and/or a water-soluble organic compound may be contained therein within a range where the effects aimed by one or more embodiments of the invention are not reduced.

The water-soluble organic compound usable in one or more embodiments of the invention is not particularly limited and is suitably selectable from publicly known ones. Preferable examples thereof include an oxygen-containing compound.

The oxygen-containing compound is not particularly limited as long as it contains oxygen, and examples thereof include a hydroxy group-containing compound, a carbonyl group-containing compound, an ether group-containing compound and a sulfoxide group-containing compound.

Examples of the carbonyl group-containing compound include isophorone, propylene carbonate, cyclohexanone and γ-butyrolactone. One type of these may be used alone, or two or more types thereof may be used in combination.

(Water-Soluble Binder)

The transparent conductive layer forming application liquid of one or more embodiments of the invention contains the water-soluble binder having a structural unit represented by the following General Formula (I).

The "water-soluble" in the water-soluble binder of one or more embodiments of the invention means that 0.001 g or more thereof is dissolved in 100 g of water at 25° C. The solubility is measured with a haze meter, a turbidimeter or the like so as to be determined.

[Chem. 2]

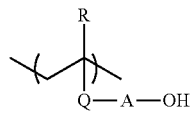

General Formula (I)

In the above General Formula (I), R represents a hydrogen atom or a methyl group; Q represents C(=O)O or C(=O)NRa, and Ra represents an atomic group to form a morpholine group with a hydrogen atom, an alkyl group or a nitrogen atom; and A represents a substituted or non-substituted alkylene group or $(CH_2CHRbO)_x$—$(CH_2CHRb)$, Rb represents a hydrogen atom or an alkyl group, and x represents a number of 0 to 100 as an average number of repeating units.

The alkyl groups represented by Ra and Rb each are preferably a straight-chain or branched alkyl group having 1 to 5 carbon atoms and far preferably a methyl group. The alkyl groups may each further be substituted by a substituent.

Examples of these substituents include an alkyl group, a cycloalkyl group, an aryl group, a heterocycloalkyl group, a heteroaryl group, a hydroxy group, a halogen atom, an alkoxy group, an alkylthio group, an arylthio group, a cycloalkoxy group, an aryloxy group, an acyl group, an alkylcarbonamide group, an arylcarbonamide group, an alkylsulfonamide group, an arylsulfonamide group, an ureido group, an aralkyl group, a nitro group, an alkoxycarbonyl group, an aryloxycarbonyl group, an aralkyloxycarbonyl group, an alkylcarbamoyl group, an arylcarbamoyl group, an alkylsulfamoyl group, an arylsulfamoyl group, an acyloxy group, an alkenyl group, an alkynyl group, an alkylsulfonyl group, an arylsulfonyl group, an alkyloxysulfonyl group, an aryloxysulfonyl group, an alkylsulfonyloxy group and an arylsulfonyloxy group. Among them, a hydroxy group and an alkyloxy group are preferable.

In the above-mentioned group of the substituents, the alkyl group may be branched, having preferably 1 to 20 carbon atoms, far preferably 1 to 12 carbon atoms and still far preferably 1 to 8 carbon atoms. Examples of the alkyl group include a methyl group, an ethyl group, a propyl group, an isopropyl group, a butyl group, a t-butyl group, a hexyl group and an octyl group. The cycloalkyl group has preferably 3 to 20 carbon atoms, far preferably 3 to 12 carbon atoms and still far preferably 3 to 8 carbon atoms. Examples of the cycloalkyl group include a cyclopropyl group, a cyclobutyl group, a cyclopentyl group and a cyclohexyl group. The alkoxy group may be branched, having preferably 1 to 20 carbon atoms, far preferably 1 to 12 carbon atoms, still far preferably 1 to 6 carbon atoms and most preferably 1 to 4 carbon atoms. Examples of the alkoxy group include a methoxy group, an ethoxy group, a 2-methoxyethoxy group, a 2-methoxy-2-ethoxyethoxy group, a butyloxy group, a hexyloxy group and an octyloxy group, and among them, an ethoxy group is preferable. The alkylthio group may be branched, having preferably 1 to 20 carbon atoms, far preferably 1 to 12 carbon atoms, still far preferably 1 to 6 carbon atoms and most preferably 1 to 4 carbon atoms. Examples of the alkylthio group include a methylthio group and an ethylthio group. The arylthio group has preferably 6 to 20 carbon atoms and far preferably 6 to 12 carbon atoms. Examples of the arylthio group include a phenylthio group and a naphthylthio group. The cycloalkoxy group has preferably 3 to 12 carbon atoms and far preferably 3 to 8 carbon atoms. Examples of the cycloalkoxy group include a cyclopropoxy group, a cyclobutyloxy group, a cyclopentyloxy group and a cyclohexyloxy group.

Further, in the above-mentioned group of the substituents, the aryl group has preferably 6 to 20 carbon atoms and far preferably 6 to 12 carbon atoms. Examples of the aryl group include a phenyl group and a naphthyl group. The aryloxy group has preferably 6 to 20 carbon atoms and far preferably 6 to 12 carbon atoms. Examples of the aryloxy group include a phenoxy group and a naphthoxy group. The heterocycloalkyl group has preferably 2 to 10 carbon atoms and far preferably 3 to 6 carbon atoms. Examples of the heterocycloalkyl group include a piperidino group, a dioxanyl group and a 2-morpholinyl group. The heteroaryl group has preferably 3 to 20 carbon atoms and far preferably 3 to 10 carbon atoms. Examples of the heteroaryl group include a thienyl group and a pyridyl group. The acyl group has preferably 1 to 20 carbon atoms and far preferably 1 to 12 carbon atoms. Examples of the acyl group include a formyl group, an acetyl group and a benzoyl group. The alkylcarbonamide group has preferably 1 to 20 carbon atoms and far preferably 1 to 12 carbon atoms. Examples of the alkylcarbonamide group include an acetamide group. The arylcarbonamide group has preferably 1 to 20 carbon atoms and far preferably 1 to 12 carbon atoms. Examples of the arylcarbonamide group include a benzamide group. The alkylsulfonamide group has preferably 1 to 20 carbon atoms and far preferably 1 to 12 carbon atoms. Examples of the alkylsulfonamide sulfonamide group include a methanesulfonamide group. The arylsulfonamide group has preferably 1 to 20 carbon atoms and far preferably 1 to 12 carbon atoms. Examples of the arylsulfonamide group include a benzenesulfonamide group and a p-toluenesulfonamide group.

Further, in the above mentioned group of the substituents, the aralkyl group has preferably 7 to 20 carbon atoms and far preferably 7 to 12 carbon atoms. Examples of the aralkyl group include a benzyl group, a phenethyl group and a naphthylmethyl group. The alkoxycarbonyl group has preferably 1 to 20 carbon atoms and far preferably 2 to 12 carbon atoms. Examples of the alkoxycarbonyl group include a methoxycarbonyl group. The aryloxycarbonyl group has preferably 7 to 20 carbon atoms and far preferably 7 to 12 carbon atoms. Examples of the aryloxycarbonyl group include a phenoxycarbonyl group. The aralkyloxycarbonyl group has preferably 8 to 20 carbon atoms and far preferably 8 to 12 carbon atoms. Examples of the aralkyloxycarbonyl group include a benzyloxycarbonyl group. The acyloxy group has preferably 1 to 20 carbon atoms and far preferably 2 to 12 carbon atoms. Examples of the acyloxy group include an acetoxy group and a benzoyloxy group. The alkenyl group has preferably 2 to 20 carbon atoms and far preferably 2 to 12 carbon atoms. Examples of the alkenyl group include a vinyl group, an allyl group and an isopropenyl group. The alkynyl group has preferably 2 to 20 carbon atoms and far preferably 2 to 12 carbon atoms. Examples of the alkynyl group include an ethynyl group. The alkylsulfonyl group has preferably 1 to 20 carbon atoms and far preferably 1 to 12 carbon atoms. Examples of the alkylsulfonyl group include a methylsulfonyl group and an ethylsulfonyl group. The arylsulfonyl group has preferably 6 to 20 carbon atoms and far preferably 6 to 12 carbon atoms. Examples of the arylsulfonyl group include a phenylsulfonyl group and a naphthylsulfonyl group. The alkyloxysulfonyl group has preferably 1 to 20 carbon atoms and far preferably 1 to 12 carbon atoms. Examples of the alkyloxysulfonyl group include a methoxysulfonyl group and an ethoxysulfonyl group. The aryloxysulfonyl group has preferably 6 to 20 carbon atoms and far preferably 6 to 12 carbon atoms. Examples of the aryloxysulfonyl group include a phenoxysulfonyl group and a naphthoxysulfonyl group. The alkylsulfonyloxy group has preferably 1 to 20 carbon atoms and far preferably 1 to 12 carbon atoms. Examples of the alkylsulfonyloxy group include a methylsulfonyloxy group and an ethylsulfonyloxy group. The arylsulfonyloxy group has preferably 6 to 20 carbon atoms and far preferably 6 to 12 carbon atoms. Examples of the arylsulfonyloxy group include a phenylsulfonyloxy group and a naphthylsulfonyloxy group.

The substituents may be the same or different and also may further be substituted.

In the above General Formula (I), A represents a substituted or non-substituted alkylene group or $(CH_2CHRbO)_x$—$(CH_2CHRb)$. The alkylene group is, for example, preferably an alkylene group having 1 to 5 carbon atoms and far preferably an ethylene group or a propylene group. The alkylene group may be substituted by a substituent selected from the above mentioned group of the substituents.

In the above General Formula (I), Rb represents a hydrogen atom or an alkyl group. The alkyl group may be substituted by a substituent selected from the above mentioned group of the substituents. Further, x represents an average number of repeating units and is within a range from 0 to 100, preferably within a range from 0 to 10. In general, the number of repeating units "x" has a distribution and is given by an average value, which may be given to the first decimal place.

In General Formula (I), R represents a hydrogen atom or a methyl group; and Q represents $C(=O)O$ or $C(=O)NRa$, and Ra represents an atomic group to form a morpholine group with a hydrogen atom, an alkyl group or a nitrogen atom.

Representative and specific examples of the structural unit represented by General Formula (I) are shown below. However, embodiments of the invention are not limited thereto.

[Chem. 3]

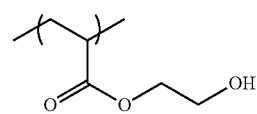

I-1

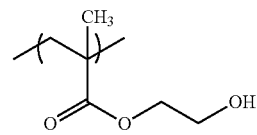

I-2

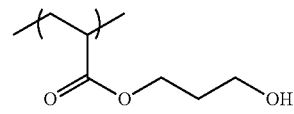

I-3

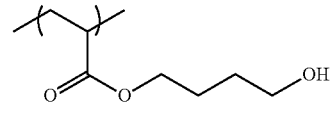

I-4

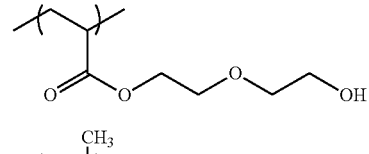

I-5

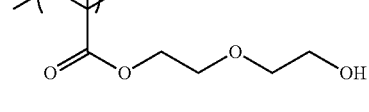

I-6

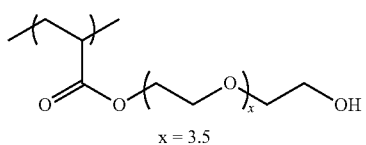
I-7

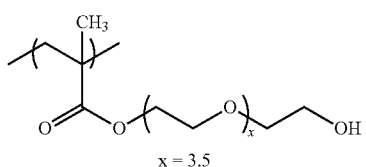
I-8

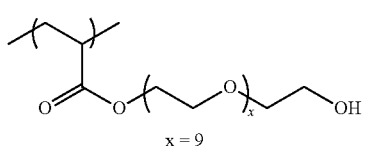
I-9

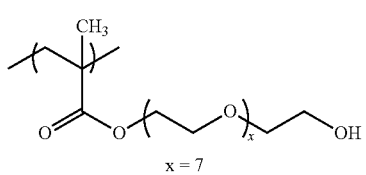
I-10

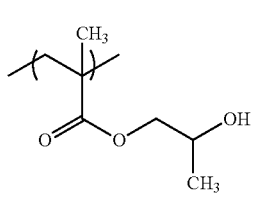
I-11

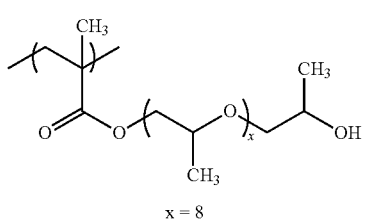
I-12

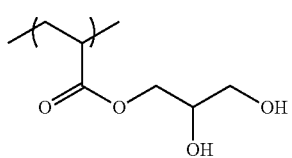
I-13

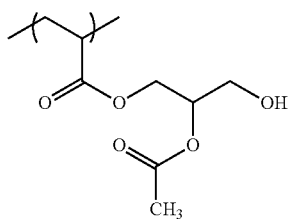
I-14

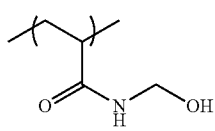
I-15

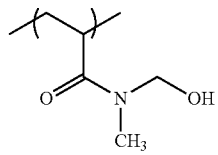
I-16

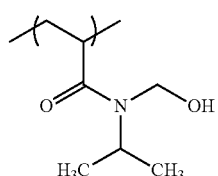
I-17

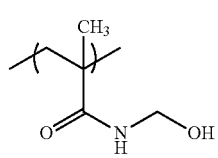
I-18

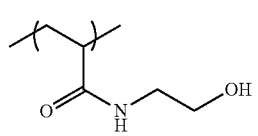
I-19

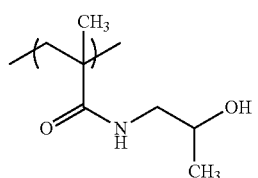
I-20

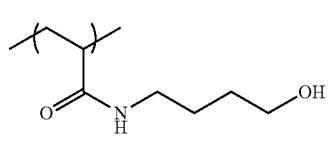
I-21

In the water-soluble binder in accordance with one or more embodiments of the invention, a mole ratio of the structural unit, which has a hydroxy group at an end, represented by General Formula (I), is preferably within a range from 10 to 100 mol % and far preferably within a range from 30 to 90 mol %.

In accordance with one or more embodiments of the invention, the water-soluble binder may be a homopolymer formed of a monomer having the structural unit represented by General Formula (I) alone or a copolymer containing another structural unit too.

In accordance with one or more embodiments of the invention, the water-soluble binder can be obtained by radical polymerization with a general-purpose polymerization catalyst. Examples of the polymerization form include bulk polymerization, solution polymerization, suspension polymerization and emulsion polymerization, and among them, solution polymerization is preferable. The polymerization temperature is generally within a temperature range from −10 to 250° C., preferably within a temperature range from 0 to 200° C. and far preferably within a temperature range from 10 to 100° C., although it differs depending on an initiator to use.

The number average molecular weight of the water-soluble binder of one or more embodiments of the invention is preferably within a range from 3,000 to 2,000,000, far preferably within a range from 4,000 to 500,000 and still far preferably within a range from 5,000 to 100,000.

The number average molecular weight and the molecular weight distribution (weight average molecular weight/number average molecular weight=Mw/Mn) of the water-soluble binder of one or more embodiments of the invention are measurable by the generally known gel permeation chromatography (GCP).

The solvent to use is not particularly limited as long as it has a lytic potential to the water-soluble binder, but preferably THF (tetrahydrofuran), DMF (dimethylformamide) or $CH_2Cl_2$ (dichloromethane), far preferably THF or DMF and still far preferably DMF. The measurement temperature is not particularly limited, but preferably 40° C.

[Method for Forming Transparent Conductive Layer]

In accordance with one or more embodiments of the invention, the transparent conductive layer may be formed by applying, by printing, the transparent conductive layer forming application liquid having the above described structure onto the transparent substrate on which the thin metal wire is formed.

As the printing applicable to one or more embodiments of the invention, usable are printing such as gravure printing, flexographic printing, screen printing and inkjet printing, and also coating such as roller coating, bar coating, dip coating, spin coating, casting, die coating, blade coating, bar coating, gravure coating, curtain coating, spray coating and doctor coating.

Among them, inkjet printing may be preferable in terms of productivity and a patterning property to the conductive metal layer, in particular, in terms of uniformity in thickness on the thin metal wire and the substrate, which leads to improvement in the rectification ratio of an organic EL device.

(Inkjet Printing)

<1. Overview of Inkjet Printing Apparatus>

In accordance with one or more embodiments of the invention, the transparent conductive layer may be preferably formed by inkjet printing. Hereinafter, inkjet printing suitably used in accordance with one or more embodiments of the invention is detailed.

Figure 2:
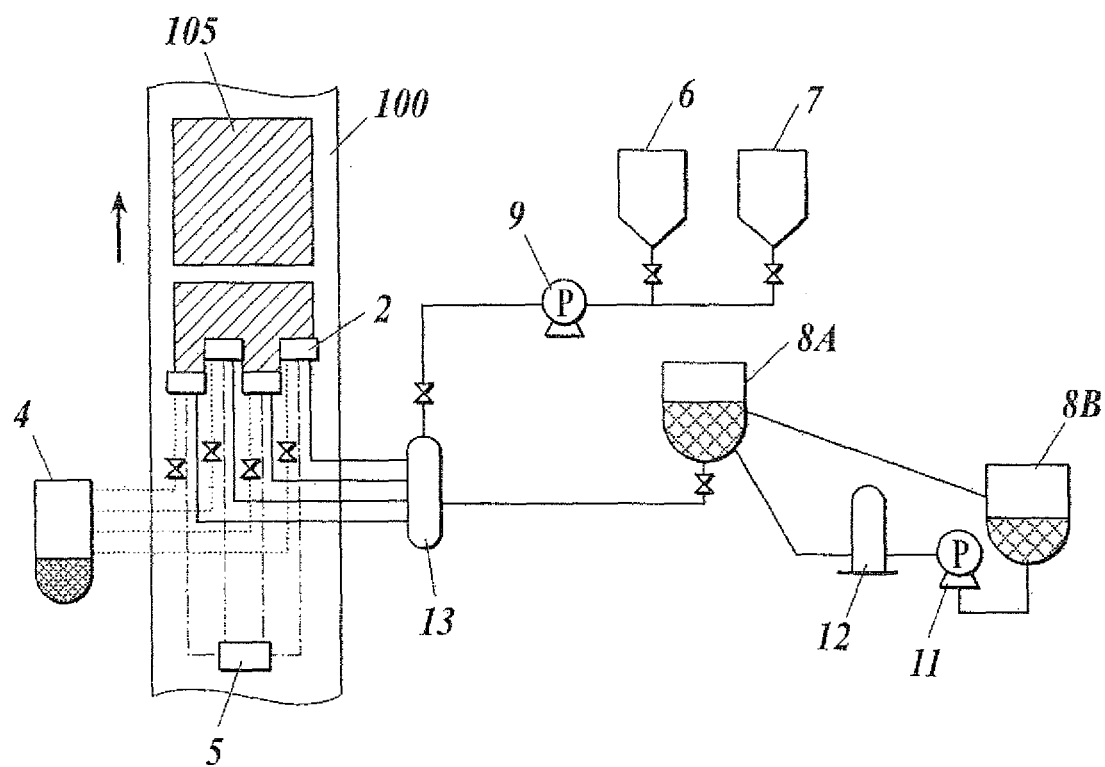
FIG. 2 is a schematic view showing an example of inkjet printing using an inkjet printing apparatus to give a transparent conductive layer onto a transparent substrate on which a thin metal wire is formed in accordance with one or more embodiments of the invention.

FIG. 2 is a schematic view showing an example of a method of applying the transparent conductive layer to each division having a certain area on the transparent substrate on which the thin metal wire is formed, using an inkjet printing apparatus provided with inkjet heads in accordance with one or more embodiments of the invention.

As shown in FIG. 2, a transparent substrate 100 is continuously conveyed, and inkjet heads 2 eject the transparent conductive layer forming application liquid for forming a transparent conductive layer as fine ink droplets, whereby a conductive layer 105 is formed thereon and then passes through a drying zone (not shown).

The inkjet head(s) 2 usable for one or more embodiments of the invention includes but is not particularly limited to: a shear mode (piezoelectric type) inkjet head which has ink pressure chambers having vibration plates provided with piezoelectric elements and discharges a transparent conductive layer forming application liquid as an ejection liquid by pressure change of the ink pressure chambers by the vibration plates; and a thermal type inkjet head which has heat generating elements and discharges a transparent conductive layer forming application liquid as an ejection liquid from nozzles by rapid volume change of the transparent conductive layer forming application liquid by film boiling with thermal energy from the heat generating elements.

To the inkjet heads 2, a mechanism to supply the ejection liquid is connected. The ejection liquid is supplied by a tank 8A. In order to keep pressure of the ejection liquid in the inkjet heads 2, in this example, the tank's liquid level is kept at a certain level. Consequently, the ejection liquid overflows from the tank 8A and returns to a tank 8B by gravity flow. The ejection liquid is supplied from the tank 8B to the tank 8A by a pump 11, and driving conditions are set in accordance with ejection conditions so that the liquid level of the tank 8A is stably kept at a certain level.

When the pump 11 returns the ejection liquid to the tank 8A, the ejection liquid passes through a filter 12. Thus, in one or more embodiments of the invention, before supplied to the inkjet heads 2, the ejection liquid pass through a filter medium having an absolute filtration accuracy or quasi-absolute filtration accuracy of 0.05 to 50 μm at least once so as to remove insoluble matters or foreign matters.

For liquid filling and cleaning of the inkjet heads 2, the transparent conductive layer forming application liquid as the ejection liquid and a cleaning solvent can be forcibly supplied from a tank 6 and a tank 7, respectively, to the inkjet heads 2 by a pump 9. For the inkjet heads 2, a plurality of these tanks/pump(s) may be provided; branches of a pipe may be used; or these may be combined. In FIG. 2, a pipe branching part 13 is used. Further, for sufficient removal of the air in the inkjet heads 2, while the ejection liquid is forcibly sent from the tank 6 to the inkjet heads 2 by the pump 9, the ejection liquid may be drawn out from an air extraction pipe described below and sent to a waste liquid tank 4.

Further, for keeping the ejection liquid in the inkjet heads 2 at a constant temperature, a heat exchanger may be provided between the tank 8A and the inkjet heads 2, or thermal insulation mechanisms to keep the ejection liquid in the inkjet heads 2 at a constant temperature, like the heat exchanger, may be provided in the inkjet heads 2.

Next, the procedure for forming the transparent conductive layer by inkjet printing is described below in accordance with one or more embodiments of the invention.

First, as a step for filling the inkjet heads 2 with the transparent conductive layer forming application liquid as the ejection liquid, the transparent conductive layer forming application liquid is forcibly flowed by the pump 9 from the tank 6 to the inkjet heads 2 which are at their waiting positions. The transparent conductive layer forming application liquid which discharges at the time is received by a not-shown catch pan or the like. By this operation, the inkjet heads 2 are filled with the transparent conductive layer forming application liquid as the ejection liquid, and after the air inside the inkjet heads is drawn therefrom, the nozzle surface (ejection face) is cleaned.

Next, the transparent conductive layer forming application liquid as the ejection liquid is sent from the tank 8B into the tank 8A at a predetermined flow rate and starts circulating by overflow. A valve between the pump 9 and the inkjet heads 2 is closed, and the transparent conductive layer forming application liquid can be ejected from the inkjet heads 2 by opening valves between the tank 8A and the inkjet heads 2. The transparent substrate 100 on which the thin metal wire is formed is conveyed at a predetermined speed, the inkjet heads 2 which are ready for ejection are brought close to the transparent substrate 100, on which the thin metal wire is formed, having a predetermined distance therebetween, and starts ejecting the transparent conductive layer forming application liquid as the ejection liquid under the predetermined ejection conditions. Since the liquid level of the tank 8A is kept at a certain level by overflow, the ejection amount is stable.

The inkjet heads 2 may be any type. In one or more embodiments of the invention, the ejection conditions under which the ejection can be stably carried out may be selected at a one-droplet amount of several ten pl and an ejection frequency of several hundred to several ten thousand Hz. The speed is arbitrary, but the faster speed leads to improvement in productivity. The ejection is carried out with the frequency adjusted according to the speed so as to obtain a target wet thickness.

<2. Inkjet Head>

The inkjet heads 2 usable in the inkjet printing apparatus are detailed in accordance with one or more embodiments of the invention.

Figure 3:
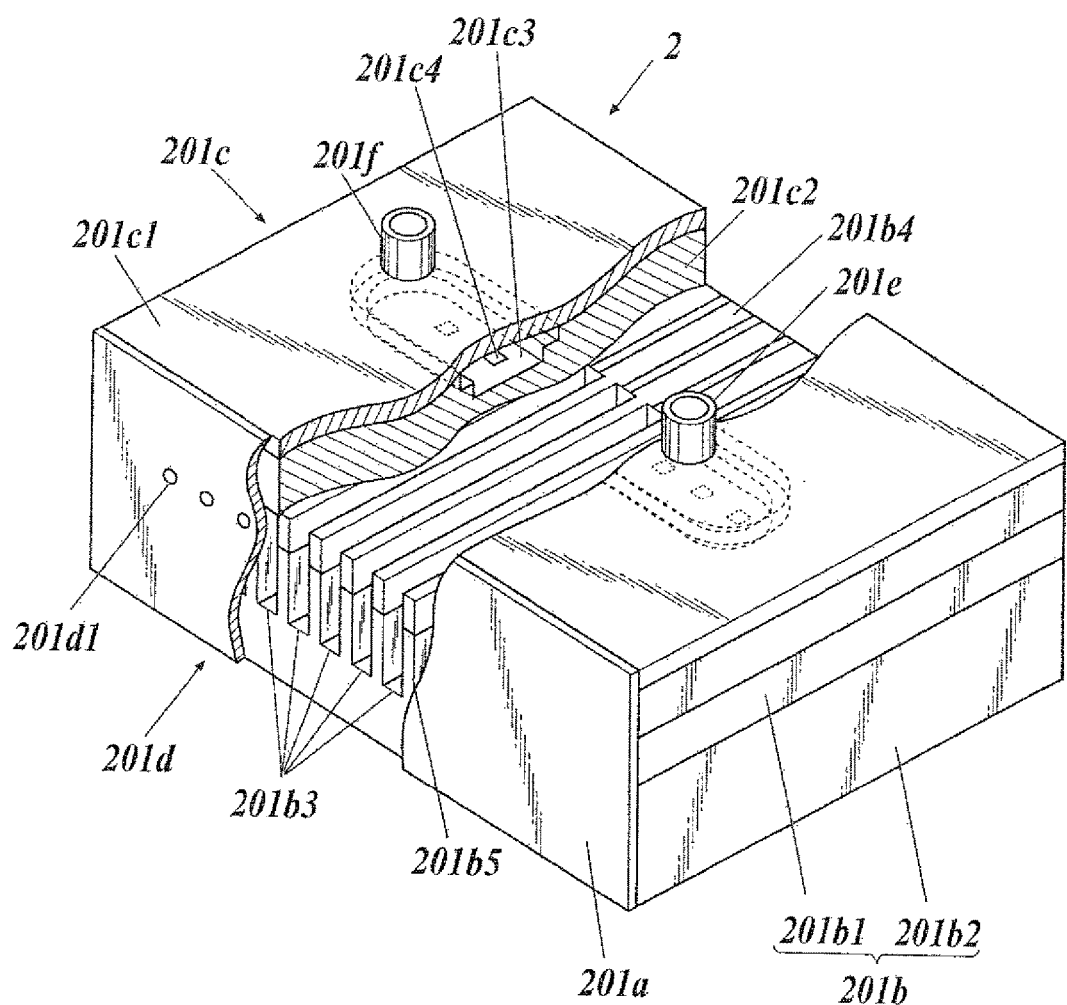
FIG. 3 is a schematic perspective view showing an example of an inkjet head with a broken-out section in accordance with one or more embodiments of the invention.

FIG. 3 is a schematic perspective view showing an example of an inkjet head with a broken-out section. The inkjet head shown in FIG. 3 is a shear mode (piezoelectric type) inkjet head in accordance with one or more embodiments of the invention.

As shown in FIG. 2, to the inkjet heads 2, a control unit 5 (shown in FIG. 2) for driving piezoelectric substrates is connected via a connector (not shown). The control unit 5, for example, selects the motion strength and the frequency of the piezoelectric substrates for the time of ejection of the transparent conductive layer forming application liquid as the ejection liquid.

In FIG. 3, the inkjet head 2 has a piezoelectric substrate 201b formed by connecting an upper piezoelectric substrate 201b1 and a lower piezoelectric substrate 201b2, a top plate 201c, and a nozzle plate 201d in accordance with one or more embodiments of the invention.

The piezoelectric substrate 201b has: a plurality of nozzles 201b3 being ground in such a way as to be open on the nozzle plate 201d side and closed on the opposite side, being parallel to each other, and having a predetermined length; a flat face 201b4 leading to the closed side of the nozzles 201b3; and side walls 201b5 on the both sides of the nozzles (ink pressure chambers) 201b3.

The plurality of nozzles may be used as nozzles for application liquid pressure chambers and nozzles for air pressure chambers alternately.

FIG. 3 shows the case where the nozzles are used as those for application liquid pressure chambers. A first top plate which covers the upper side of the piezoelectric substrate 201b is represented by 201c2, and a second top plate which covers the upper side of the first top plate is represented by 201c1.

An application liquid supply pipe for an application liquid is represented by 201e. The application liquid supplied from the application liquid supply pipe 201e is discharged from nozzles' discharge openings 201d1.

A storage part for the application liquid supplied from the application liquid supply pipe 201e is represented by 201c3. The application liquid is supplied to the nozzles 201b3 for application liquid pressure chambers from application liquid supply openings 201c4 which communicate with the nozzles 201b3.

The nozzles 201b3 are covered with the first top plate 201c2 and the nozzle plate 201d, whereby a plurality of airtight channels (application liquid pressure chambers) are formed.

The nozzles' discharge openings from which the transparent conductive layer forming application liquid is ejected and flies as ink droplets by pressure change of the application liquid pressure chambers following sharing deformation of the side walls are represented by 201d1. The interval between the nozzles' discharge openings is preferably within a range from 0.02 to 0.3 mm.

The pipe used for, for example, air extraction of the transparent conductive layer forming application liquid is represented by 201f. The pipe 201f is tightly closed with a valve or the like when the application liquid is ejected.

Materials for the first top plate 201c2 and the second top plate 201c1 are not particularly limited and may be, for example, organic materials, but also alumina, aluminum nitride, zirconia, silicon, silicon nitride, silicon carbide, quartz, lead zirconate titanate (PZT) or the like.

As a base material for the nozzle plate 201d, metal or resin is used. Preferably usable examples thereof include stainless steel, polyimide, polysulfone and polyethersulfone. In particular, polyimide resins such as Kapton manufactured by Dupont K.K. and Upilex manufactured by Ube Industries, Ltd. are preferable because of their excellence in size stability, ink resistance, heat resistance and the like.

<Organic Electronic Device>>

In accordance with one or more embodiments of the invention, the transparent electrode manufactured in accordance with the above described method has both high conductivity and high transparency and is suitably usable in the fields of: various optoelectronics devices, such as crystal liquid display devices, organic luminescent devices, inorganic electroluminescent devices, electronic paper, organic solar cells and inorganic solar cells; electromagnetic shields; touch panels; and so forth. Among them, it can be particularly preferably used as a transparent electrode of an organic EL device or an organic thin film solar cell device strictly demanded to have smoothness of the transparent electrode surface.

In accordance with one or more embodiments of the invention, the organic electronic device has a first transparent electrode as which the transparent electrode of one or more embodiments of the invention is used, a second electrode arranged opposite to the first transparent electrode, and the organic functional layer of at least one layer and arranged between the first transparent electrode and the second electrode.

Examples of the organic functional layer, which constitutes the organic electronic device of one or more embodiments of the invention, include but are not particularly limited to an organic luminescent layer, an organic photoelectric conversion layer and a crystal liquid polymer layer. However, in one or more embodiments of the invention, when the organic functional layer is composed of the organic luminescent layer or the organic photoelectric conversion layer which is thin and a current-driven device, it is particularly effective.

In one or more embodiments of the invention, the organic functional layer may have, in addition to the organic luminescent layer or the organic photoelectric conversion layer, organic layers, such as the positive hole injection layer, the positive hole transport layer, the electron transport layer, the electron injection layer, the positive hole block layer and the electron block layer, which control light emission with the organic luminescent layer. In one or more embodiments of the invention, the transparent conductive layer having the conductive polymer can double as the positive hole injection layer in the organic electronic device. However, for easy movement of positive holes, the positive hole injection layer may be independently provided at a position adjacent to the transparent conductive layer.

[Organic EL Device]

Next, an organic electroluminescent device (organic EL device) which is one of representative modes of the organic electronic device of one or more embodiments of the invention is described in accordance with one or more embodiments of the invention.

Figure 4:
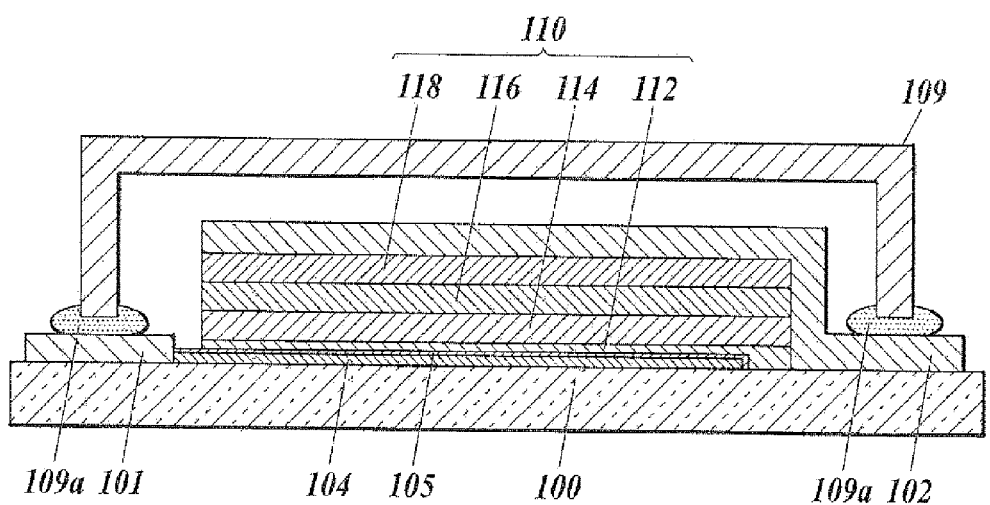
FIG. 4 is a cross-sectional view schematically showing an example of the structure of an organic EL device in accordance with one or more embodiments of the invention.

FIG. 4 is a cross-sectional view schematically showing an example of the structure of the organic EL device described in accordance with one or more embodiments of the invention. FIGS. 5 to 8 are top views showing an example of the flow of manufacturing steps for the organic EL device described in accordance with one or more embodiments of the invention.

As shown in FIG. 4, an organic EL device has a first transparent electrode composed of a thin metal wire 104 and a transparent conductive layer 105 on a transparent substrate 100 and a second electrode 102 arranged opposite to the first transparent electrode. An organic functional layer 110 of at least one layer is arranged between the first transparent electrode and the second electrode 102. In FIG. 4, as the structure of the organic functional layer 110, a structure composed of a positive hole transport layer 112, a luminescent layer 114, a positive hole block layer 116 and an electron transport layer 118 is shown as an example.

In the organic EL device, a sealing member 109 is arranged to cover a display region, and the sealing member 109 and the electrodes (first transparent electrode and second electrode 102) are sealed to each other with an adhesive layer 109a provided therebetween.

Next, a method for manufacturing the organic EL device is described in summary with reference to FIGS. 5 to 8 described in accordance with one or more embodiments of the invention.

Figure 5:
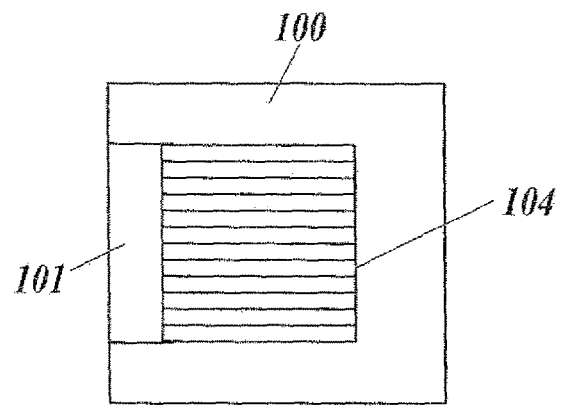
FIG. 5 is a plan view showing a step of forming a thin metal wire in a method for manufacturing an organic EL device in accordance with one or more embodiments of the invention.

First, as shown in FIG. 5, a transparent substrate 100 is prepared. An extraction electrode 101 is formed on a side edge of the transparent substrate 100, and a thin metal wire 104 is formed on the center part of the transparent substrate 100. In this case, the thin metal wire 104 overlaps the extraction electrode 101 so as to be electrically connected thereto.

Figure 6:
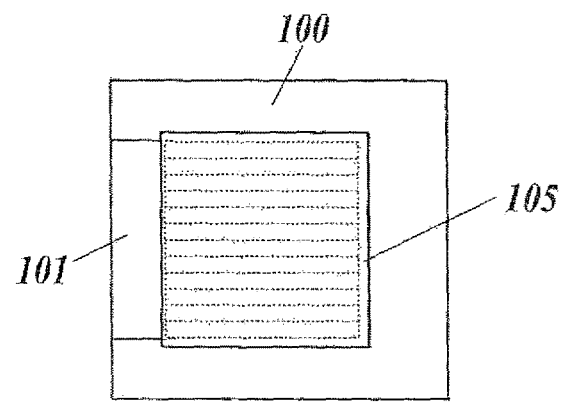
FIG. 6 is a plan view showing a step of forming a transparent conductive layer in the method for manufacturing an organic EL device in accordance with one or more embodiments of the invention.

Next, as shown in FIG. 6, a certain transparent conductive layer forming application liquid is applied by inkjet printing in such a way as to cover the entire thin metal wire 104, whereby a transparent conductive layer 105 is formed on the thin metal wire 104 and on the transparent substrate 100 exposed therefrom.

Figure 7:
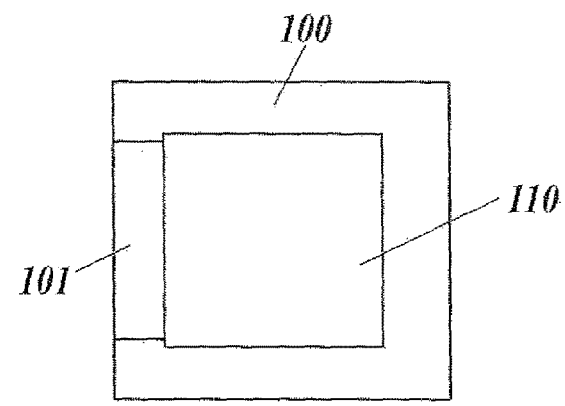
FIG. 7 is a plan view showing a step of forming an organic functional layer in the method for manufacturing an organic EL device in accordance with one or more embodiments of the invention.
Figure 8:
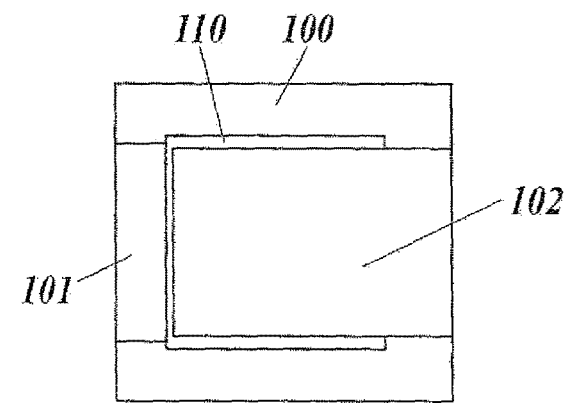
FIG. 8 is a plan view showing a step of forming a second electrode in the method for manufacturing an organic EL device in accordance with one or more embodiments of the invention.

Next, as shown in FIG. 7, an organic functional layer 110 is formed on a first electrode composed of the thin metal wire 104 and the transparent conductive layer 105. Next, as shown in FIG. 8, a second electrode 102 is formed on the organic functional layer 110.

Next, as shown in FIG. 4, the electrodes and the organic functional layer 110 are sealed by a sealing member 109 with an adhesive which constitutes an adhesive layer 109a.

[1: First Transparent Electrode]

The first transparent electrode is the transparent electrode of one or more embodiments of the invention and is the anode in the organic EL device.

In one or more embodiments of the invention, the first transparent electrode includes: the thin metal wire 104; and the transparent conductive layer 105 composed of the conductive polymer and the water-soluble binder. The transparent conductive layer 105 composed of the conductive polymer and the water-soluble binder fills gaps in the thin metal wire 104.

Details of the thin metal wire 104 and the transparent conductive layer 105 are described above, and therefore description thereof is omitted here.

[2: Organic Functional Layer]

Examples of the organic functional layer 110 include but are not particularly limited to the organic luminescent layer, the organic photoelectric conversion layer and the crystal liquid polymer layer. However, in one or more embodiments of the invention, when the functional layer is composed of the organic luminescent layer or the organic photoelectric conversion layer which is thin and a current-driven device, it is particularly effective.

The thin metal wire 104 is connected to the extraction electrode 101. The extraction electrode 101 is not particularly limited as long as it has high conductivity. Examples thereof include a metal, metal fine particles/metal nanoparticles, a metal oxide and an alloy.

The organic EL device having the organic luminescent layer may have, in addition to the organic luminescent layer, layers, such as the positive hole injection layer, the positive hole transport layer, the positive hole block layer, the electron transport layer and the electron injection layer which control light emission with the organic luminescent layer.

Specific examples of the structure thereof are shown below, but embodiments of the invention are not limited thereto.

(i) (first transparent electrode)/organic luminescent layer/electron transport layer/(second electrode)

(ii) (first transparent electrode)/positive hole transport layer/organic luminescent layer/electron transport layer/(second electrode)

(iii) (first transparent electrode)/positive hole transport layer/organic luminescent layer/positive hole block layer/electron transport layer/(second electrode)

(iv) (first transparent electrode)/positive hole transport layer/organic luminescent layer/positive hole block layer/electron transport layer/electron injection layer/(second electrode)

(v) (first transparent electrode)/positive hole injection layer/positive hole transport layer/organic luminescent layer/positive hole block layer/electron transport layer/electron injection layer/(second electrode)

(2.1: Organic Luminescent Layer)

In the organic EL device of one or more embodiments of the invention, the organic luminescent layer may be composed of a single-color luminescent layer of any of these respectively having maximum emission wavelengths of 430 to 480 nm, 510 to 550 nm and 600 to 640 nm, or may be composed of a white luminescent layer which is composed of at least those three organic luminescent layers being stacked, optionally having non-luminescent intermediate layers between the organic luminescent layers.

In the organic EL device of one or more embodiments of the invention, the organic luminescent layer is preferably the white luminescent layer.

In one or more embodiments of the invention, examples of a luminescent material and a dopant material usable for the organic luminescent layer include but are not limited to anthracene, naphthalene, pyrene, tetracene, coronene, perylene, phthaloperylene, naphthaloperylene, diphenylbutadiene, tetraphenylbutadiene, coumarin, carbazole, azacarbazole, oxadiazole, bisbenzoxazoline, bisstyryl, cyclopentadiene, quinoline metal complex, tris(8-hydroxyquinolinate) aluminum complex, tris(4-methyl-8-quinolinate) aluminum complex, tris(5-phenyl-8-quinolinate) aluminum complex, aminoquinoline metal complex, benzoquinoline metal complex, tri-(p-terphenyl-4-yl)amine, 1-aryl-2,5-di(2-thienyl)pyrrole derivative, pyran, quinacridone, rubrene, distylbenzene derivative, distylarylene derivative, and various fluorescent dyes, rare earth metal complexes and phosphorescent materials.

The organic luminescent layer preferably contains 90.0 to 99.5 parts by mass of a luminescent material and 0.5 to 10 parts by mass of a dopant material selected from the above mentioned compounds.

The organic luminescent layer is formed of any of the above mentioned materials and the like by a publicly known method, such as vapor deposition, application or transfer. The thickness of the organic luminescent layer is preferably 0.5 to 500 nm and particularly preferably 0.5 to 200 nm.

(2.2: Block Layer; Positive Hole Block Layer and Electron Block Layer)

The block layer is provided as needed in addition to the basic constituent layers of the thin film composed of an organic compound(s). Examples thereof include positive hole block layers mentioned in documents such as Japanese Patent Application Laid-Open Publication Nos. 11-204258 and 11-204359 and p. 273 of "Yuki E L Soshi To Sono Kogyoka Saizensen (Organic EL Element and Front of Industrialization thereof) (Nov. 30, 1998, published by N.T.S Co., Ltd.)".

The positive hole block layer has a function of the electron transport layer in a broad sense, is composed of a positive hole block material having a function to transport electrons with a significantly low property to transport positive holes, and can increase recombination probability of electrons and positive holes by blocking positive holes while transporting electrons.

Further, as needed, the structure of the electron transport layer described below can be used for the positive hole block layer. The positive hole block layer disposed in the white organic EL device may be disposed adjacent to the luminescent layer.

On the other hand, the electron block layer has a function of the positive hole transport layer in a broad sense, is composed of a material having a function to transport positive holes with a significantly low property to transport electrons, and can increase recombination probability of electrons and positive holes by blocking electrons while transporting positive holes.

Further, as needed, the structure of the positive hole transport layer described below can be used for the electron block layer.

The thickness of each of the positive hole block layer and the electron transport layer of one or more embodiments of the invention is preferably 100 nm or less and far preferably within a range from 5.0 to 30 nm.

(2.3: Positive Hole Transport Layer)

The positive hole transport layer is composed of a positive hole transport material having a function to transport positive holes, and, in a broad sense, the positive hole injection layer and the electron block layer are of the positive hole transport layer.

The positive hole transport layer may be composed of a single layer or a plurality of layers.

The positive hole transport material is a material having either the property to inject or transport positive holes or a barrier property against electrons, and is either an organic matter or an inorganic matter.

Examples thereof include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an oligomer of a conductive high polymer such as a thiophene oligomer.

As the positive hole transport material, those mentioned above can be used. However, it may be preferable to use a porphyrin compound, an aromatic tertiary amine compound or a styrylamine compound, in particular an aromatic tertiary amine compound.

Representative examples of the aromatic tertiary amine compound and the styrylamine compound include: N,N,N',N'-tetraphenyl-4,4'-diaminophenyl; N,N'-diphenyl-N,N'-bis(3-methylphenyl)-[1,1'-biphenyl]-4,4'-diamine (abb.: TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-metyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule mentioned in U.S. Pat. No. 5,061,569, such as 4,4'-bis[N-(1-naphthyl)-N-phenylamino]biphenyl (abb.: NDP); and 4,4',4"-tris[N-(3-methylphenyl)-N-phenylamino]triphenylamine (abb.: MTDATA) in which three triphenylamine units are bonded in a star burst form mentioned in Japanese Patent Application Laid-Open Publication No. 4-308688. High polymer materials in each of which any of these materials is introduced into a high polymer chain or constitutes a main chain of a high polymer can also be used.

Inorganic compounds such as a p type-Si and a p type-SiC can also be used as the positive hole injection material and the positive hole transport material.

It is also possible to use positive hole transport materials having so-called p type semiconductor property mentioned in documents such as Japanese Patent Application Laid-Open Publication Nos. 4-297076, 2000-196140 and 2001-102175, J. Appl. Phys., 95, 5773 (2004), Japanese Patent Application Laid-Open Publication No. 11-251067, a document by J. Huang et al. (Applied Physics Letters, 80 (2002), p. 139), and Published Japanese Translation of PCT International Publication for Patent Application No. 2003-519432.

In one or more embodiments of the invention, it may be preferable to use these materials in view of producing a light emitting element having higher efficiency.

The positive hole transport layer can be formed by forming a thin film of any of the above-mentioned positive hole transport materials by a well-known method such as vacuum deposition, spin coating, casting, printing including inkjet printing, or the LB method.

The thickness of the positive hole transport layer is not particularly limited, but it is generally about 5 nm to 5 μm, preferably within a range from 5 to 200 nm.

The positive hole transport layer may have a single-layer structure composed of one type or two or more types of the above-mentioned materials.

(2.4: Electron Transport Layer)

The electron transport layer is composed of a material having a function to transport electrons, and, in a broad sense, the electron injection layer and the positive hole block layer are of the electron transport layer. The electron transport layer may be composed of a single layer or a plurality of layers.

Conventionally, in the case of the electron transport layer composed of a single layer or a plurality of layers, what is needed for the electron transport material (which doubles as the positive hole block material) used for the electron transport layer adjacent to the cathode side of the luminescent layer is to have a function to transfer electrons injected from the cathode to the luminescent layer. The material to be used can be suitably selected from well-known compounds. Examples thereof include a nitro-substituted fluorene derivative, a diphenylquinone derivative, a thiopyrandioxide derivative, carbodiimide, a fluorenylidenemethane derivative, anthraquinonedimethane, an anthrone derivative and an oxadiazole derivative.

A thiadiazole derivative formed in such a way that an oxygen atom of an oxadiazole ring of the above-mentioned oxadiazole derivative is substituted by a sulfur atom and a quinoxaline derivative having a quinoxaline ring which is well-known as an electron withdrawing group can also be used as the electron transport material. Further, high polymer materials in each of which any of these materials is introduced into a high polymer chain or constitutes a main chain of a high polymer can also be used.

Still further, metal complexes of 8-quinolinol derivatives such as: tris(8-quinolinol)aluminum (abb.: $Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (abb.: Znq); and metal complexes formed in such a way that central metal of each of the above-mentioned metal complexes is substituted by In, Mg, Cu, Ca, Sn, Ga or Pb can also be used as the electron transport material.

Yet further, metal-free and metal phthalocyanine and ones formed in such a way that an end of each of these is substituted by an alkyl group, a sulfonic acid group or the like can also be used as the electron transport material by preference.

Still further, the distyrylpyrazine derivative mentioned as an example of the material of the luminescent layer can also be used as the electron transport material. Yet further, inorganic semiconductors such as an n type-Si and an n type-SiC can also be used as the electron transport material, as with the positive hole injection layer and the positive hole transport layer.

The electron transport layer can be formed by forming a thin film of any of the above-mentioned electron transport materials by a well-known method such as vacuum deposition, spin coating, casting, printing including inkjet printing, or the LB method.

The thickness of the electron transport layer is not particularly limited, but it is generally about 5 nm to 5 μm, preferably 5 to 200 nm.

The electron transport layer may have a single-layer structure composed of one type or two or more types of the above-mentioned materials.

Further, an electron transport material having n type semiconductor property doped with impurities can also be used. Examples thereof include those mentioned in documents such as Japanese Patent Application Laid-Open Publication Nos. 4-297076, 10-270172, 2000-196140 and 2001-102175 and J. Appl. Phys., 95, 5773 (2004). In one or more embodiments of the invention, the electron transport material having n type semiconductor property may be used because this enables manufacture of a device which consumes lower electric power.

(2.5: Injection Layer; Electron Injection Layer and Positive Hole Injection Layer)

The injection layer is a layer disposed between an electrode and the organic functional layer for reduction in the driving voltage and increase in luminance of light emitted, which is detailed, for example, in Part 2, Chapter 2 "Denkyoku Zairyo (Electrode Material)" (pp. 123-166) of "Yuki E L Soshi To Sono Kogyoka Saizensen (Organic EL Element and Front of Industrialization thereof) (Nov. 30, 1998, published by N.T.S Co., Ltd.)", and examples thereof include the positive hole injection layer and the electron injection layer.

The positive hole injection layer is demanded to have a small difference from the first transparent electrode in a work function. The positive hole injection layer is also detailed in documents such as Japanese Patent Application Laid-Open Publication Nos. 9-45479, 9-260062 and 8-288069, and examples thereof include: a phthalocyanine buffer layer of, for example, copper phthalocyanine; an oxide buffer layer of, for example, vanadium oxide; an amorphous carbon buffer layer; and a conductive polymer layer of, for example, polyaniline (emeraldine) or polythiophene. In particular, in terms of usability in the coating, a conductive polymer layer may be used.

The conductive polymer used for the positive hole injection layer may be a polyanion having fluorine (F) in the compound in terms of the work function. Fluorine may be added later, and a perfluorinated polyanion may also be used.

Specific examples thereof include Nafion (manufactured by DuPont K.K.) containing a perfluorosulfonic acid group and Flemion (manufactured by Asahi Glass Co., Ltd.) composed of a perfluorovinyl ether containing a carboxylic acid group.

The electron injection layer is detailed in documents such as Japanese Patent Application Laid-Open Publication Nos. 6-325871, 9-17574 and 10-74586, and examples thereof include: a metal buffer layer of, for example, strontium or aluminum; an alkali metal compound buffer layer of, for example, lithium fluoride; an alkali earth metal compound buffer layer of, for example, magnesium fluoride; and an oxide buffer layer of, for example, aluminum oxide.

The injection layer may be a very thin film, and the thickness thereof be within a range from 0.1 nm to 5 μm although it depends on the material to use. When a conductive polymer is used, the thickness thereof is preferably within a range from 5.0 to 50 nm in terms of transparency, in particular.

[3: Second Electrode]

The second electrode is the cathode in the organic EL device in accordance with one or more embodiments of the invention.

The second electrode may be a single layer composed of a conductive material(s) or may use, in addition to the conductive material(s), resin to keep them.

As the conductive material for the second electrode, one composed of, as an electrode matter, a metal (called an electron injectable metal), an alloy, an electrical conductive compound or a mixture thereof having a small work function (4 eV or less) is used.

Specific examples of the electrode matter include: sodium; sodium-potassium alloy; magnesium; lithium; magnesium/copper mixture; magnesium/silver mixture; magnesium/aluminum mixture; magnesium/indium mixture; aluminum/aluminum oxide ($Al_2O_3$) mixture; indium; lithium/aluminum mixture; and rare-earth metal.

Among these, in terms of the electron injection property and durability against oxidation or the like, a mixture of an electron injectable metal and a second metal having a value of the work function larger than that of the electron injectable metal and being a stable metal is preferable. Suitable examples thereof include: magnesium/silver mixture; magnesium/aluminum mixture; magnesium/indium mixture; aluminum/aluminum oxide ($Al_2O_3$) mixture; lithium/aluminum mixture; and aluminum. The cathode can be manufactured by forming a thin film of any of the above-mentioned electrode matters by a method such as vapor deposition or sputtering.

The sheet resistivity of the cathode may be several hundred Ω/□ or less. The thickness is selected from normally a range from 10 nm to 5 μm, preferably a range from 50 to 200 nm.

[4: Sealing Member]

The sealing member may be an concave plate or a flat plate as long as it is arranged to cover the display region of the organic EL device. In addition, transparency and electric insulation thereof are not particularly specified.

In one or more embodiments of the invention, a polymer film or a metal film can be used in order to make the organic EL device thin.

Examples of the adhesive for forming the adhesive layer include: photo-curable and thermosetting adhesives having a reactive vinyl group of an acrylic acid oligomer or a methacrylic acid oligomer; and moisture-curable adhesives such as 2-cyanoacrylate. Examples of the adhesive further include thermosetting and chemical curing (two-liquid-mixed) ones such as an epoxy-based one, still further include hot-melt ones such as polyamide, polyester and polyolefin and yet further include cationic curing ones such as a UV-curable epoxy resin adhesive.

Further, outside the electrode on the side opposite to the transparent substrate with the organic functional layer therebetween, a layer composed of an inorganic matter or an organic matter may be suitably formed as a sealing film in such a way as to cover the electrode and the organic functional layer and contact the transparent substrate.

In this case, as a material which forms the above-described sealing film, any material is used as long as it is impermeable to matters such as moisture and oxygen which cause degradation of a device. Usable examples thereof include silicon oxide, silicon dioxide and silicon nitride.

EXAMPLES

Hereinafter, embodiments of the invention are detailed with Examples. However, embodiments of the invention are not limited thereto. Note that "%" used in Examples stands for "mass % (percent by mass)" unless otherwise specified.

First Example

Manufacture of Transparent Electrode

[Manufacture of Transparent Electrode 1]
[Formation of Thin Metal Wire 1]

Prepared was a 5.0 cm square glass substrate having a thickness of 0.5 mm. The glass substrate was soaked in 2-propanol, subjected to ultrasonic cleaning for ten minutes with an ultrasonic cleaner Bransonic 3510J-MT (manufactured by Emerson Japan, Ltd.), and dried at 250° C. for 30 minutes.

After that, in the area of 3.0 cm×3.0 cm of the cleaned glass substrate, a striped thin metal wire 1 was printed by screen printing with a silver nanoparticle ink (TEC-PA-010 manufactured by InkTec Co., Ltd.) in such a way as to be a wire width of 50 μm, a wire interval of 1.0 mm and a wire height (thickness) of 1.0 μm, and heated at 250° C. for ten minutes.

As a printing machine, a small type semi-auto printing machine STF-150IP (manufactured by Tokai Shoji Co., Ltd.) was used, and also a plate having a wire diameter of 13 μm (manufactured by Sonocom Ltd., Co.) was used. The form of the thin metal wire 1 was measured with a high-luminescent non-contact three-dimensional surface roughness meter Wyko NT9100.

(Preparation of Transparent Conductive Layer Forming Application Liquid 1)

The following materials for forming a transparent conductive layer were mixed successively and then dissolved by heating, so that a transparent conductive layer forming application liquid 1 was prepared.

1) Conductive polymer 1 (PEDOT-PSS, Clevios PH510, manufactured by Heraeus Holding, solid concentration; 1.89%, PEDOT:PSS (solid ratio)=1:2.5) 15.9 g 2) Aqueous solution of water-soluble binder 1 (polyhydroxyethyl acrylate, see below, PHEA, solid concentration; 20.0%) 3.5 g 3) Polar solvent (dimethyl sulfoxide, abb.: DMSO, log P value: −1.49) 3.6 g 4) Glycol ether (ethylene glycol monobutyl ether, abb.: EGBu) 0.7 g In the above transparent conductive layer forming application liquid 1, the content of 3) polar solvent (dimethyl sulfoxide) was 15 mass % in the total mass of the transparent conductive layer forming application liquid 1, and the content of 4) glycol ether (ethylene glycol monobutyl ether) was 3.0 mass % in the total mass of the transparent conductive layer forming application liquid 1.

<Water-Soluble Binder 1: Synthesis of Polyhydroxyethyl Acrylate (Illustrated Compound I-1)>

In a 500 ml three-neck flask, 200 ml of tetrahydrofuran (abbreviated to "THF" hereinafter) was poured, heated to reflux for ten minutes, and then cooled to room temperature under nitrogen. Next, 2-hydroxyethyl acrylate (10.0 g, 86 mmol, molecular weight: 116.05) and azobisisobutyronitrile (abbreviated to "AIBN" hereinafter, 1.41 g, 8.5 mmol, molecular weight: 164.11) were added thereto and heated to reflux for five hours. After cooled to room temperature, the above reaction solution was dropped into 5000 ml of methyl ethyl ketone (abbreviated to "MEK" hereinafter) and stirred for one hour. After MEK was decanted, cleaning was carried out three times with 200 ml of MEK, and then the polymer was dissolved with THF. The resulting product was transferred to a 100 ml flask. After THF was subjected to vacuum distillation with a rotary evaporator, vacuum drying was carried out at 50° C. for three hours. Consequently, 9.0 g (yield of 90%) of a water-soluble binder 1 (polyhydroxyethyl acrylate, abb.: PHEA) having a number average molecular weight of 35700 and a molecular weight distribution of 2.3 was obtained. Next, the water-soluble binder 1 was dissolved in water, so that an aqueous solution of the water-soluble binder 1 having a solid concentration of 20% was prepared.

The molecular weight was measured with GPC (Waters 2695 manufactured by Waters Corporation) under the following measurement conditions.

<GPC Measurement Conditions>

Device: Wagers 2695 (Separations Module)
Detector: Waters 2414 (Refractive Index Detector)
Column: Shodex Asahipak GF-7M HQ Eluent: dimethylformamide (20 mM LiBr)
Flow velocity: 1.0 ml/min
Temperature: 40° C.

(Formation of Transparent Conductive Layer 1 by Inkjet Printing)

On the glass substrate on which the thin metal wire 1 was formed, the prepared transparent conductive layer forming application liquid 1 was applied to the area of 3.3 cm×3.3 cm by inkjet printing, so that a transparent conductive layer 1 was formed, and accordingly a transparent electrode 1 was manufactured.

For inkjet printing, an inkjet head(s) having an ink droplet ejection amount of 42 pl was used, and pattern printing was carried out by adjusting the application speed and the ejection frequency in such a way that the dry thickness became 400 nm. After printing, heat treatment was carried out at 250° C. for 30 minutes with a heater. Thus, the transparent electrode 1 was obtained. As an inkjet printing apparatus, a desktop-type robot Shotmaster-300 (manufactured by Musashi Engineering, Inc.) provided with an inkjet head(s) (manufactured by Konica Minolta IJ Technologies, Inc.) was used, and control was made by an inkjet evaluation system EB150 (manufactured by Konica Minolta IJ Technologies, Inc.).

[Manufacture of Transparent Electrodes 2 to 31]

Transparent electrodes 2 to 31 were manufactured in the same way as the transparent electrode 1, except for using, instead of the transparent conductive layer forming application liquid 1 used for forming the transparent conductive layer 1 in manufacturing the transparent electrode 1, transparent conductive layer forming application liquids 2 to 31 each prepared with that the type and added amount (mass %) of 3) polar solvent and the type and added amount (mass %) of 4) glycol ether changed to those shown in TABLE 1.

In manufacturing the transparent electrodes 2 to 31, the added amount of 1) conductive polymer 1 was 15.9 g, and the added amount of 2) water-soluble binder 1 was 3.5 g, which were the fixed amounts in all of them, and the added amounts of 3) polar solvent and 4) glycol ether were adjusted in such a way as to be the mass % shown in TABLE 1.

[Manufacture of Transparent Electrode 32]

A transparent electrode 32 was manufactured in the same way as the transparent electrode 4, except that a transparent conductive layer 32 was formed by using, instead of the transparent conductive layer forming application liquid 4 used for forming the transparent conductive layer 4 in manufacturing the transparent electrode 4, a transparent conductive layer forming application liquid 32 described below.

(Preparation of Transparent Conductive Layer Forming Application Liquid 32)

The following materials for forming a transparent conductive layer were mixed successively and then dissolved by heating, so that the transparent conductive layer forming application liquid 32 was prepared.

1) Conductive polymer 1 (PEDOT-PSS, Clevios PH510, manufactured by Heraeus Holding, solid concentration; 1.89%, PEDOT:PSS (solid ratio)=1:2.5) 15.9 g 2) Aqueous solution of water-soluble binder 2 (poly hydroxyethyl acrylamide, see below, PHEAA, solid concentration; 20.0%) 3.5 g 3) Polar solvent (dimethyl sulfoxide, abb.: DMSO, log P value: −1.49) 4.2 g 4) Glycol ether (ethylene glycol monobutyl ether, aab.: EGBu) 4.2 g In the above transparent conductive layer forming application liquid 32, the content of 3) polar solvent (dimethyl sulfoxide) was 15 mass % in the total mass of the transparent conductive layer forming application liquid 32, and the content of 4) glycol ether (ethylene glycol monobutyl ether) was 15 mass % in the total mass of the transparent conductive layer forming application liquid 32.

<Water-Soluble Binder 2: Synthesis of Poly Hydroxyethyl Acrylamide (Illustrated Compound I-19)>

Poly hydroxyethyl acrylamide (abb.: PHEAA) was obtained as a water-soluble binder 2 in the same way as the water-soluble binder 1 (polyhydroxyethyl acrylate), except for using, instead of 2-hydroxyethyl acrylate used as a monomer in synthesizing the water-soluble binder 1, hydroxyethyl acrylamide. Next, the water-soluble binder 2 was dissolved in water, so that an aqueous solution of the water-soluble binder 2 having a solid concentration of 20% was prepared.

The water-soluble binder 2 (poly hydroxyethyl acrylamide) was measured by the above method and had a number average molecular weight of 36500 and a molecular weight distribution of 2.2.

[Manufacture of Transparent Electrode 33]

A transparent electrode 33 was manufactured by using a transparent conductive layer forming application liquid 33 prepared in the same way as the transparent conductive layer forming application liquid 32 used for forming the transparent conductive layer 32 in manufacturing the transparent electrode 32, except for 3) polar solvent and 4) glycol ether changed to propylene glycol (abb.: PG, log P value: −0.47) and propylene glycol monobutyl ether (abb.: PGBu), respectively.

[Manufacture of Transparent Electrode 34]

A transparent electrode 34 was manufactured in the same way as the transparent electrode 4, except that a transparent conductive layer 34 was formed by using, instead of the transparent conductive layer forming application liquid 4 used for forming the transparent conductive layer 4 of the transparent electrode 4, a transparent conductive layer forming application liquid 34 described below.

(Preparation of Transparent Conductive Layer Forming Application Liquid 34)

The following materials for forming a transparent conductive layer were mixed successively and then dissolved by heating, so that the transparent conductive layer forming application liquid 34 was prepared.

1) Conductive polymer 1 (PEDOT-PSS, Clevios PH510, manufactured by Heraeus Holding, solid concentration; 1.89%, PEDOT:PSS (solid ratio)=1:2.5) 15.9 g 2) Aqueous solution of water-soluble binder 3 (copolymer (PHEA/PHEAA) of polyhydroxyethyl acrylate and poly hydroxyethyl acrylamide, solid concentration; 20.0%, see below) 3.5 g 3) Polar solvent (dimethyl sulfoxide, abb.: DMSO, log P value: −1.49) 4.2 g 4) Glycol ether (ethylene glycol monobutyl ether, abb.: EGBu) 4.2 g In the above transparent conductive layer forming application liquid 34, the content of 3) polar solvent (dimethyl sulfoxide) was 15 mass % in the total mass of the transparent conductive layer forming application liquid 34, and the content of 4) glycol ether (ethylene glycol monobutyl ether) was 15 mass % in the total mass of the transparent conductive layer forming application liquid 34.

<Water-Soluble Binder 3: Synthesis of Copolymer of Polyhydroxyethyl Acrylate and Poly Hydroxyethyl Acrylamide>

In a 200 ml three-neck flask, 100 ml of THF was poured, heated to reflux for ten minutes, and then cooled to room temperature under nitrogen. Next, 2-hydroxyethyl acrylate (4.1 g, 35 mmol, molecular weight: 116.05), hydroxyethyl acrylamide (illustrated compound 1-19) (1.7 g, 15 mmol, molecular weight: 115.15) and AIBN (0.8 g, 5 mmol, molecular weight: 164.11) were added thereto and heated to reflux for five hours. After cooled to room temperature, the above reaction solution was dropped into 3000 ml of MEK and stirred for one hour. After MEK was decanted, cleaning was carried out three times with 100 ml of MEK, and then the polymer was dissolved with THE The resulting product was transferred to a 100 ml flask. After THF was subjected to vacuum distillation with a rotary evaporator, vacuum drying was carried out at 50° C. for three hours. Consequently, 10.3 g (yield of 90%) of copolymer (abb.: PHEA/PHEAA) of polyhydroxyethyl acrylate and poly hydroxyethyl acrylamide having a number average molecular weight of 33700 and a molecular weight distribution of 2.4 was obtained. Next, the water-soluble binder 3 was dissolved in water, so that an aqueous solution of the water-soluble binder 3 having a solid concentration of 20% was prepared.

[Manufacture of Transparent Electrode 35]

A transparent electrode 35 was manufactured by using a transparent conductive layer forming application liquid 35 prepared in the same way as the transparent conductive layer forming application liquid 4 used for forming the transparent conductive layer 4 of the transparent electrode 4, except for 4) glycol ether (ethylene glycol monobutyl ether) removed.

[Manufacture of Transparent Electrode 36]

A transparent electrode 36 was manufactured by using a transparent conductive layer forming application liquid 36 prepared in the same way as the transparent conductive layer forming application liquid 4 used for forming the transparent conductive layer 4 of the transparent electrode 4, except for 3) polar solvent (dimethyl sulfoxide) removed.

[Manufacture of Transparent Electrode 37]

A transparent electrode 37 was manufactured by using a transparent conductive layer forming application liquid 37 prepared in the same way as the transparent conductive layer forming application liquid 4 used for forming the transparent conductive layer 4 of the transparent electrode 4, except for 3) polar solvent (dimethyl sulfoxide) and 4) glycol ether (ethylene glycol monobutyl ether) removed.

[Manufacture of Transparent Electrode 38]

A transparent electrode 38 was manufactured in the same way as the transparent electrode 4, except that a transparent conductive layer 38 was formed by using, instead of the transparent conductive layer forming application liquid 4 used for forming the transparent conductive layer 4 of the transparent electrode 4, a transparent conductive layer forming application liquid 38 described below.

(Preparation of Transparent Conductive Layer Forming Application Liquid 38)

The following materials for forming a transparent conductive layer were mixed successively and then dissolved by heating, so that the transparent conductive layer forming application liquid 38 was prepared.

1) Conductive polymer 1 (PEDOT-PSS, Clevios PH510, manufactured by Heraeus Holding, solid concentration; 1.89%, PEDOT:PSS (solid ratio)=1:2.5) 20.0 g 3) Polar solvent (dimethyl sulfoxide, abb.: DMSO, log P value: −1.49) 4.29 g 4) Glycol ether (ethylene glycol monobutyl ether, abb.: EGBu) 4.29 g In the above transparent conductive layer forming application liquid 38, the content of 3) polar solvent (dimethyl sulfoxide) was 15 mass % in the total mass of the transparent conductive layer forming application liquid 38, and the content of 4) glycol ether (ethylene glycol monobutyl ether) was 15 mass % in the total mass of the transparent conductive layer forming application liquid 38.

[Manufacture of Transparent Electrodes 39 to 43]

(Preparation of Conductive Polymers 2 and 3)

A conductive polymer 2 having a solid concentration of 1.0 mass % and PEDOT:PSS=1:30 and a conductive polymer 3 having a solid concentration of 1.0 mass % and PEDOT:PSS=1:40 were synthesized in accordance with a method described in Published Japanese Translation of PCT International Publication for Patent Application No. 2008-541471.

(Manufacture of Transparent Electrodes)

Transparent electrodes 39 to 43 were manufactured in the same way as the transparent electrode 38, except that their respective transparent conductive layers 39 to 43 were formed by respectively using transparent conductive layer forming application liquids 39 to 43 each prepared in the same way as the transparent conductive layer forming application liquid 38 used for forming the transparent conductive layer 38 of the transparent electrode 38, except for the type of the conductive polymer, the type and added amount (mass %) of the polar solvent, and the type and added amount (mass %) of the glycol ether changed to the combination thereof shown in TABLE 1.

The structures of thus manufactured transparent electrodes are shown in TABLE 1.

TABLE 1

| | | | | TRANSPARENT CONDUCTIVE LAYER | | | | | |
|---|---|---|---|---|---|---|---|---|---|
| | | | WATER- | POLAR SOLVENT | | | GLYCOL ETHER | | |
| *1 | NO. | CONDUCTIVE POLYMER | SOLUBLE BINDER | TYPE | LogP VALUE | CONTENT (mass %) | TYPE | CONTENT (mass %) | REMARK |
| 1 | 1 | 1 | 1 | DMSO | −0.68 | 15 | EGBu | 3 | *2 |
| 2 | 2 | 1 | 1 | DMSO | −0.68 | 15 | EGBu | 5 | *3 |
| 3 | 3 | 1 | 1 | DMSO | −0.68 | 15 | EGBu | 8 | *3 |
| 4 | 4 | 1 | 1 | DMSO | −0.68 | 15 | EGBu | 15 | *3 |
| 5 | 5 | 1 | 1 | DMSO | −0.68 | 15 | EGBu | 20 | *3 |
| 6 | 6 | 1 | 1 | DMSO | −0.68 | 15 | EGBu | 25 | *3 |
| 7 | 7 | 1 | 1 | DMSO | −0.68 | 15 | EGBu | 30 | *2 |
| 8 | 8 | 1 | 1 | DMSO | −0.68 | 25 | EGBu | 3 | *2 |
| 9 | 9 | 1 | 1 | DMSO | −0.68 | 25 | EGBu | 30 | *2 |

TABLE 1-continued

| | | | | TRANSPARENT CONDUCTIVE LAYER | | | | | |
|---|---|---|---|---|---|---|---|---|---|
| | | | WATER- | POLAR SOLVENT | | | GLYCOL ETHER | | |
| *1 | NO. | CONDUCTIVE POLYMER | SOLUBLE BINDER | TYPE | LogP VALUE | CONTENT (mass %) | TYPE | CONTENT (mass %) | REMARK |
| 10 | 10 | 1 | 1 | DMSO | −0.68 | 3 | EGBu | 3 | *2 |
| 11 | 11 | 1 | 1 | DMSO | −0.68 | 3 | EGBu | 30 | *2 |
| 12 | 12 | 1 | 1 | PG | −0.47 | 15 | PGBu | 15 | *3 |
| 13 | 13 | 1 | 1 | 1,3-PG | −0.68 | 15 | PGBu | 15 | *3 |
| 14 | 14 | 1 | 1 | EG | −0.79 | 15 | PGBu | 15 | *3 |
| 15 | 15 | 1 | 1 | DGEMe | −0.58 | 15 | EGBu | 10 | *3 |
| 16 | 16 | 1 | 1 | TEGMe | −0.74 | 15 | EGBu | 10 | *3 |
| 17 | 17 | 1 | 1 | DEG | −0.95 | 15 | EGBu | 15 | *3 |
| 18 | 18 | 1 | 1 | TEG | −1.10 | 15 | EGBu | 15 | *3 |
| 19 | 19 | 1 | 1 | GC | −1.33 | 15 | EGBu | 15 | *3 |
| 20 | 20 | 1 | 1 | DPG | −0.31 | 15 | EGBu | 15 | *2 |
| 21 | 21 | 1 | 1 | NMP | −0.34 | 15 | EGBu | 15 | *2 |
| 22 | 22 | 1 | 1 | BG | −0.37 | 15 | EGBu | 15 | *2 |
| 23 | 23 | 1 | 1 | IPA | −0.38 | 15 | EGBu | 15 | *2 |
| 24 | 24 | 1 | 1 | DMSO | −0.68 | 15 | DEGDMe | 15 | *3 |
| 25 | 25 | 1 | 1 | DMSO | −0.68 | 15 | EGPr | 15 | *3 |
| 26 | 26 | 1 | 1 | DMSO | −0.68 | 10 | PGMe | 10 | *3 |
| 27 | 27 | 1 | 1 | DMSO | −0.68 | 15 | PGBu | 15 | *3 |
| 28 | 28 | 1 | 1 | DMSO | −0.68 | 5 | EGBu | 15 | *3 |
| 29 | 29 | 1 | 1 | DMSO | −0.68 | 8 | EGBu | 15 | *3 |
| 30 | 30 | 1 | 1 | DMSO | −0.68 | 25 | EGBu | 15 | *3 |
| 31 | 31 | 1 | 1 | DMSO | −0.68 | 30 | EGBu | 15 | *3 |
| 32 | 32 | 1 | 2 | DMSO | −0.68 | 15 | EGBu | 15 | *3 |
| 33 | 33 | 1 | 2 | PG | −0.47 | 15 | PGBu | 15 | *3 |
| 34 | 34 | 1 | 3 | DMSO | −0.68 | 15 | EGBu | 15 | *3 |
| 35 | 35 | 1 | 1 | DMSO | −0.68 | 15 | — | — | *2 |
| 36 | 36 | 1 | 1 | — | — | — | EGBu | 15 | *2 |
| 37 | 37 | 1 | 1 | — | — | — | — | — | *2 |
| 38 | 38 | 1 | — | DMSO | −0.68 | 15 | EGBu | 15 | *2 |
| 39 | 39 | 2 | — | GC | −1.33 | 30 | EGBu | 2 | *2 |
| 40 | 40 | 2 | — | EG | −0.79 | 30 | EGBu | 2 | *2 |
| 41 | 41 | 2 | — | PG | −0.47 | 30 | EGBu | 0.5 | *2 |
| 42 | 42 | 3 | — | EG | −0.79 | 30 | EGBu | 0.5 | *2 |
| 43 | 43 | 3 | — | PG | −0.47 | 30 | EGBu | 5 | *2 |

*1: TRANSPARENT ELECTRODE NO.
*2: COMPARATIVE EXAMPLE
*3: PRESENT INVENTION

Details of the compounds shown in TABLE 1 by abbreviations are as follows.

<Conductive Polymers>

Conductive polymer 1: PEDOT-PSS (poly(3,4-ethylene dioxythiophene)-polystyrene sulfonate), Clevios PH510, manufactured by Heraeus Holding, solid concentration; 1.89%, PEDOT:PSS (solid ratio)=1:2.5

Conductive polymer 2: solid concentration; 1.0%, PEDOT:PSS (solid ratio)=1:30

Conductive polymer 3: solid concentration; 1.0%, PEDOT:PSS (solid ratio)=1:40

<Water-Soluble Binders>

Water-soluble binder 1: polyhydroxyethyl acrylate, PHEA

Water-soluble binder 2: poly hydroxyethyl acrylamide, PHEAA

Water-soluble binder 3: copolymer of polyhydroxyethyl acrylate and poly hydroxyethyl acrylamide, PHEA/PHEAA <Polar Solvents>

DMSO: dimethyl sulfoxide, log P value=−1.49
PG: propylene glycol (1,2-propanediol), log P value=−0.47
1,3-PG: 1,3-propanediol, log P value=−0.68
EG: ethylene glycol (1,2-ethanediol), log P value=−0.79
DGEMe: diethylene glycol monomethyl ether, log P value=−0.58
TEGMe: triethylene glycol monomethyl ether, log P value=−0.74
DEG: diethylene glycol, log P value=−0.95
TEG: triethylene glycol, log P value=−1.10
GC: glycerol, log P value=−1.33
DPG: dipropylene glycol, log P value=−0.31
NMP: N-methylpyrrolidone, log P value=−0.34
BG: 1,3-butylene glycol (1,3-butanediol), log P value=−0.37
IPA: isopropyl alcohol, log P value=0.38

The above log P values were calculated by ChemBioDraw Ultra (Version: 12.0).

<Glycol Ethers>

EGBu: ethylene glycol monobutyl ether (2-butoxyethanol)
PGBu: propylene glycol monobutyl ether
DEGDMe: diethylene glycol dimethyl ether
EGPr: ethylene glycol monoisopropyl ether
PGMe: propylene glycol monomethyl ether (1-methoxy-2-propanol)

<<Evaluation of Transparent Electrode>>

The transparent conductive layer forming application liquids (to be simple, abbreviated to "application liquid(s)" hereinafter), which were used in manufacturing the transparent electrodes, and the transparent electrodes were evaluated as follows.

[1] Evaluation of Application Liquid Properties (Evaluation of Application Liquid Stability)

In order to evaluate the stability of the application liquids, the application liquids were stored at 25° C. for three days, and then a viscosity change rate between before and after the storage was obtained by the following formula. The application liquid stability (viscosity stability) was evaluated according to the following criteria. The viscosity of each application liquid was measured under a condition of 25° C. with VISCOMATE VM-1G-MH (manufactured by Yamaichi Electronics Co., Ltd.) as an oscillation type viscometer.

Viscosity change rate=Viscosity after storage for three days/Viscosity before storage×100(%)

⊚ (double circle): the viscosity change rate was 90% or more and less than 110%

○ (single circle): the viscosity change rate was 110% or more and less than 120%

Δ (triangle): the viscosity change rate was 120% or more and less than 150% x (cross): the viscosity change rate was 150% or more (Evaluation of Gelation Resistance)

With respect to the application liquids stored at 25° C. for three days for evaluation of the application liquid stability described above, whether or not a gel insoluble matter was generated in each application liquid was visually observed. When no generation of a gel insoluble matter was seen, it was determined as good "○ (circle)", and when generation of a gel insoluble matter was seen, it was determined as bad "x (cross)".

(Evaluation of Ejection Stability)

In order to evaluate the ejection stability of the application liquids in inkjet printing, rectangular solid image patterns were continuously printed on inkjet paper, the formed images were visually inspected, and the number of ejection times at which a line(s) and/or an image flaw(s) were generated was counted. The ejection stability was evaluated according to the following criteria.

⊚ (double circle): no generation of lines and/or image flaws was seen in the formed images even though ejection was continuously carried out 300 times or more ○ (single circle): the number of ejection times at which no generation of lines and/or image flaws was seen was 30 or more and less than 300

Δ (triangle): the number of ejection times at which no generation of lines and/or image flaws was seen was 10 or more and less than 30 x (cross): the number of ejection times at which no generation of lines and/or image flaws was seen was less than 10

[2] Evaluation of Transparent Electrode Properties (Evaluation of Expansion/Contraction Resistance)

With respect to each manufactured transparent electrode, the length (3.3 cm) of one side of the formed transparent conductive layer was measured, and the transparent electrode was subjected to heat treatment for 30 minutes under an environment of 250° C. An expansion/contraction rate of the transparent conductive layer was calculated by the following formula taking the length (3.3 cm) of the one side of the transparent conductive layer before the heat treatment as A and the length of the one side of the transparent conductive layer after the heat treatment as B. The expansion/contraction resistance was evaluated according to the following criteria.

Expansion/Contraction rate=|B−A|/A×100(%)

⊚ (double circle): the expansion/contraction rate (absolute value) was less than 5%

○ (single circle): the expansion/contraction rate (absolute value) was 5% or more and less than 10%

Δ (triangle): the expansion/contraction rate (absolute value) was 10% or more and less than 20% x (cross): the expansion/contraction rate (absolute value) was 20% or more (Evaluation of Transparency)

With respect to each transparent electrode having the conductive polymer layer stacked therein, the total luminous transmittance was measured with a haze mater NDH5000 manufactured by Tokyo Denshoku Co., Ltd. The transparency was evaluated according to the following criteria. In this evaluation, the transmittance is preferably 65% or more (rank "○ (single circle)") and far preferably 75% or more (rank "⊚ (double circle)") in order to use the transparent electrode of one or more embodiments of the invention in an organic electronic device.

⊚ (double circle): the total luminous transmittance was 75% or more

○ (single circle): the total luminous transmittance was 65% or more and less than 75%

Δ (triangle): the total luminous transmittance was 55% or more and less than 65% x (cross): the total luminous transmittance was less than 55%

(Evaluation of Conductivity of Transparent Electrode)

Silver electrodes were formed by vapor evaporation at the both ends of the thin metal wire in such a way that the thin metal wire part became square, resistance of the both ends of the silver electrodes was measured, and surface resistivity of the transparent electrode was measured. The conductivity of each transparent electrode was evaluated according to the following criteria. When the surface resistivity is 10Ω/□ or more, the transparent electrode has high resistance and reduces its suitability for the area increase.

⊚ (double circle): the surface resistivity was less than 3 Ω/□

○ (single circle): the surface resistivity was 3Ω/□ or more and less than 10 Ω/□ x (cross): the surface resistivity was 10Ω/□ or more (Evaluation of Conductivity of Transparent Conductive Layer)

On the glass substrate, each of the transparent conductive layer forming application liquids 1 to 43 was printed by inkjet printing, so that the transparent conductive layer was formed. Next, the surface resistivity of the formed transparent conductive layer was measured with a resistivity meter (Loresta GP (Model MCP-T610) manufactured by Dia Instruments Co., Ltd.). The conductively of each transparent conductive layer was evaluated according to the following criteria.

The surface resistivity is preferably less than 3000Ω/□ (evaluation rank of "Ω (single circle)") and, for a larger organic electronic device, far preferably less than 1000Ω/□ (evaluation rank of "⊚ (double circle)").

⊚ (double circle): the surface resistivity was less than 1000 Ω/□

○ (single circle): the surface resistivity was 1000Ω/□ or more and less than 3000 Ω/□

Δ (triangle): the surface resistivity was 3000Ω/□ or more and less than 10000 Ω/□ x (cross): the surface resistivity was 10000Ω/□ or more

[3] Manufacture and Evaluation of Organic EL Device

[Manufacture of Organic EL Device]

(Manufacture of Extraction Electrode)

Prepared were 5 cm square glass substrates. The glass substrates were soaked in 2-propanol, subjected to ultrasonic cleaning for ten minutes with an ultrasonic cleaner Bransonic 3510J-MT (manufactured by Emerson Japan, Ltd.), and dried at 250° C. for 30 minutes. On each of the cleaned glass substrates, an ITO film (indium-tin oxide) was formed by sputtering to be 150 nm thick, so that an ITO substrate was manufactured, and then an anode (center part: 30 mm×30 mm) was patterned by photolithography in such a way as to leave ITO as an extraction electrode. Thus, the glass substrates each having ITO in the extraction electrode (no ITO in the anode part (center part: 30 mm×30 mm)) were manufactured.

Next, on the manufactured glass substrates each having ITO in the extraction electrode, the manufactured transparent electrodes 1 to 43 were arranged as their respective anodes, and on each of the anodes, an organic functional layer (a positive hole transport layer, an organic luminescent layer, a positive hole block layer and an electron transport layer) and a cathode were formed in the following procedure. Thus, organic EL devices 1 to 43 were manufactured.

The extraction electrode of ITO and the thin metal wire were formed in such a way as to partly contact with each other.

The positive hole layer and its following layers of the organic EL layer were formed by vapor deposition.

Vapor-deposition crucibles of a commercially available vacuum deposition device were filled with materials for the respective layers at their respectively necessary amounts to manufacture each organic EL device. The vapor-deposition crucibles used were made of a molybdenum material or a tungsten material for resistance heating.

(Formation of Organic EL Layer)

On each of the arranged transparent electrodes 1 to 43, the positive hole transport layer, the organic luminescent layer, the positive hole block layer and the electron transport layer, which constituted the organic functional layer, were successively formed in accordance with methods described below in the area of 30 mm×[[33]]30 mm of the center part of each of the transparent electrodes 1 to 43.

<Formation of Positive Hole Transport Layer>

After the pressure was reduced to a vacuum degree of 1×10⁻⁴ Pa, the vapor-deposition crucible having Compound 1 therein was electrically heated, and Compound 1 was deposited at a deposition rate of 0.1 nm/sec. Thus, the positive hole transport layer having a thickness of 30 nm was formed.

<Formation of Organic Luminescent Layer>

Next, the organic luminescent layer was formed according to the procedure below.

On the formed positive hole block layer, Compound 2, Compound 3 and Compound 5 were co-deposited in the region which was the same as the positive hole transport layer at a deposition rate of 0.1 nm/sec in such a way as to be 13.0 mass % of Compound 2, 3.7 mass % of Compound 3 and 83.3 mass % of Compound 5. Thus, an organic green-and-red phosphorescent layer having a maximum emission wavelength of 622 nm and a thickness of 10 nm was formed.

Next, Compound 4 and Compound 5 were co-deposited in the region which was the same as the organic green-and-red phosphorescent layer at a deposition rate of 0.1 nm/sec in such a way as to be 10.0 mass % of Compound 4 and 90.0 mass % of Compound 5. Thus, an organic blue phosphorescent layer having a maximum emission wavelength of 471 nm and a thickness of 15 nm was formed.

<Formation of Positive Hole Block Layer>

Next, Compound 6 was deposited in the region which was the same as the formed organic luminescent layer. Thus, the positive hole block layer having a thickness of 5 nm was formed.

<Formation of Electron Transport Layer>

Next, CsF and Compound 6 were co-deposited in the region which was the same as the formed positive hole block layer in such a way that CsF was 10% in film thickness ratio. Thus, the electron transport layer having a thickness of 45 nm was formed.

[Chem. 4]

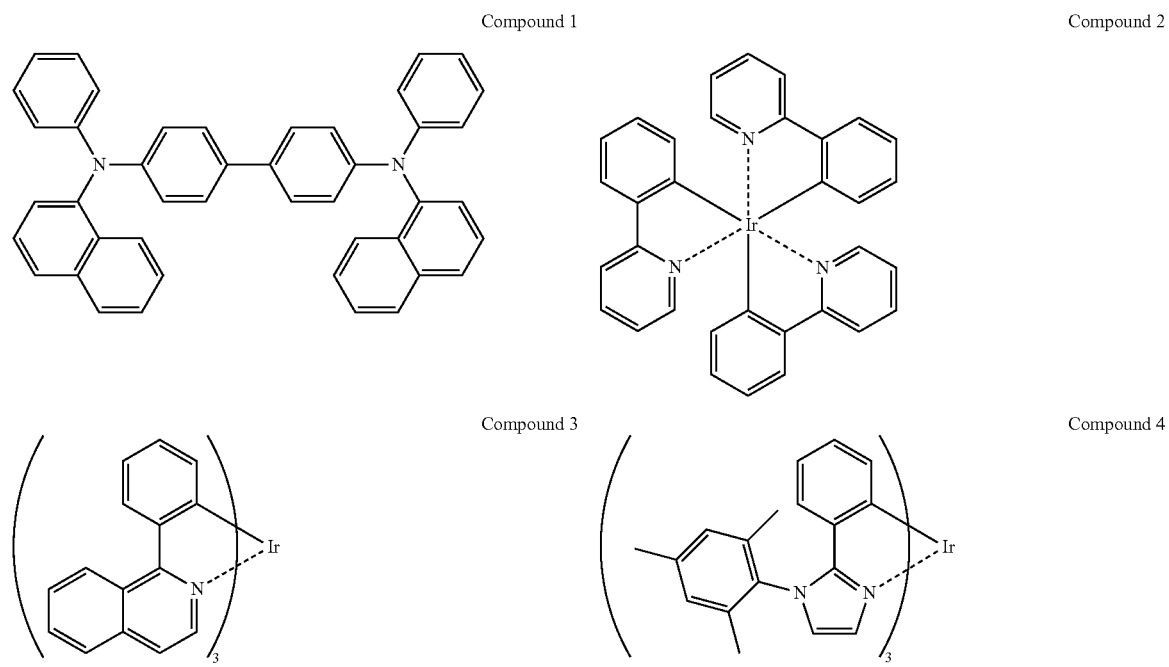

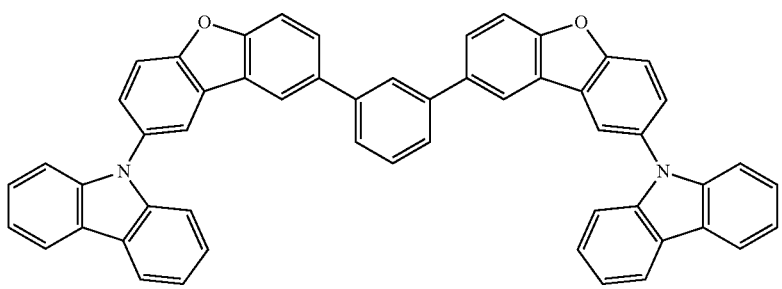

Compound 5

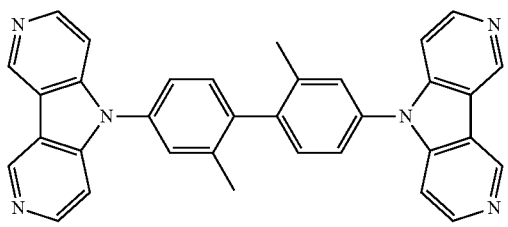

Compound 6

<Formation of Cathode>

On the formed electron transport layer of the organic functional layer, Al as a material for forming the cathode of 30 mm×42 mm was deposited with a mask under a vacuum of $5\times10^{-4}$ Pa. Thus, the cathode having a thickness of 100 nm was formed.

Finally, in order to form external extraction terminals of the cathode and the anode, an adhesive was applied to the periphery of the anode except for the edges thereof so as to glue a flexible sealing member composed of $Al_2O_3$ deposited to be 300 nm thick with polyethylene terephthalate as a substrate, and then the adhesive was cured by heat treatment, so that a sealing film was formed. Thus, the organic EL devices 1 to 43 each having a luminescent area of 30 mm×30 mm were manufactured.

The heat treatment was carried out with a heater by using a stage for the shape of the part where the adhesive was applied so as to heat only the adhesive on the periphery.

[Evaluation of Organic EL Device]

With respect to the manufactured organic EL devices 1 to 43, the rectification ratio was evaluated.

(Evaluation of Rectification Ratio)

With respect to each of ten samples of each organic EL device, a current value at application of +4 V and a current value at application of −4 V were measured, the rectification ratio was determined by the following formula, and an average value of the ten samples was obtained.

Rectification ratio=Current value at application of +4 V/Current value at application of −4 V Of the following ranks, the rank 1 or higher is essential in terms of current leakage resistance, and the rank 2 or higher is preferable in terms of the area increase.

4: the rectification ratio was $1.0\times10^4$ or more

3: the rectification ratio was $1.0\times10^3$ or more and less than $1.0\times10^4$ 2: the rectification ratio was $1.0\times10^2$ or more and less than $1.0\times10^3$ 1: the rectification ratio was $5.0\times10^1$ or more and less than $1.0\times10^2$ 0: the rectification ratio was less than $5.0\times10^1$ The obtained result is shown in TABLE 2.

TABLE 2

| | APPLICATION LIQUID PROPERTIES | | | | TRANSPARENT ELECTRODE PROPERTIES | | | ORGANIC EL DEVICE | |
|---|---|---|---|---|---|---|---|---|---|
| | | | | | TRANS- | CONDUCTIVITY | | | |
| *1 | *2 | *3 | *4 | *5 | PARENCY | *6 | *7 | *8 | REMARK |
| 1 | ◎ | ○ | ◎ | X | ◎ | ◎ | ◎ | 0 | *9 |
| 2 | ◎ | ○ | ◎ | ○ | ◎ | ◎ | ◎ | 2 | *10 |
| 3 | ◎ | ○ | ◎ | ◎ | ◎ | ◎ | ◎ | 3 | *10 |
| 4 | ◎ | ○ | ◎ | ◎ | ◎ | ◎ | ◎ | 3 | *10 |
| 5 | ◎ | ○ | ◎ | ◎ | ◎ | ◎ | ◎ | 3 | *10 |
| 6 | ○ | ○ | ○ | ○ | ◎ | ◎ | ◎ | 2 | *10 |
| 7 | Δ | X | X | Δ | ◎ | ◎ | ◎ | 0 | *9 |
| 8 | ◎ | ○ | ◎ | X | ◎ | ◎ | ◎ | 0 | *9 |
| 9 | Δ | X | X | Δ | ◎ | ◎ | ◎ | 0 | *9 |
| 10 | Δ | X | X | X | ◎ | ◎ | ◎ | 0 | *9 |
| 11 | X | X | X | Δ | ◎ | ◎ | ◎ | 0 | *9 |
| 12 | ○ | ○ | ◎ | ◎ | ◎ | ◎ | ◎ | 3 | *10 |
| 13 | ○ | ○ | ◎ | ◎ | ◎ | ◎ | ◎ | 3 | *10 |
| 14 | ○ | ○ | ◎ | ◎ | ◎ | ◎ | ◎ | 2 | *10 |
| 15 | ○ | ○ | ○ | ◎ | ◎ | ◎ | ◎ | 2 | *10 |
| 16 | ○ | ○ | ○ | ◎ | ◎ | ◎ | ◎ | 2 | *10 |

TABLE 2-continued

| | APPLICATION LIQUID PROPERTIES | | | | TRANSPARENT ELECTRODE PROPERTIES | | | ORGANIC EL DEVICE | |
|---|---|---|---|---|---|---|---|---|---|
| | | | | | TRANS- | CONDUCTIVITY | | | |
| *1 | *2 | *3 | *4 | *5 | PARENCY | *6 | *7 | *8 | REMARK |
| 17 | ○ | ○ | ○ | ◎ | ◎ | ◎ | ◎ | 2 | *10 |
| 18 | ○ | ○ | ○ | ◎ | ◎ | ◎ | ◎ | 2 | *10 |
| 19 | ○ | ○ | ○ | ◎ | ◎ | ◎ | ◎ | 2 | *10 |
| 20 | Δ | X | Δ | Δ | ◎ | ◎ | ◎ | 0 | *9 |
| 21 | Δ | X | Δ | Δ | ◎ | ◎ | ◎ | 0 | *9 |
| 22 | Δ | X | Δ | Δ | ◎ | ◎ | ◎ | 0 | *9 |
| 23 | X | X | X | X | ◎ | ◎ | ◎ | 0 | *9 |
| 24 | ○ | ○ | ○ | ○ | ◎ | ◎ | ◎ | 2 | *10 |
| 25 | ◎ | ○ | ◎ | ◎ | ◎ | ◎ | ◎ | 3 | *10 |
| 26 | ◎ | ○ | ◎ | ◎ | ◎ | ◎ | ◎ | 3 | *10 |
| 27 | ◎ | ○ | ◎ | ◎ | ◎ | ◎ | ◎ | 3 | *10 |
| 28 | ○ | ○ | ○ | ○ | ◎ | ◎ | ◎ | 2 | *10 |
| 29 | ◎ | ○ | ◎ | ◎ | ◎ | ◎ | ◎ | 3 | *10 |
| 30 | ◎ | ○ | ◎ | ◎ | ◎ | ◎ | ◎ | 3 | *10 |
| 31 | ○ | ○ | ○ | ○ | ◎ | ◎ | ◎ | 2 | *10 |
| 32 | ◎ | ○ | ◎ | ◎ | ◎ | ◎ | ◎ | 3 | *10 |
| 33 | ◎ | ○ | ◎ | ◎ | ◎ | ◎ | ◎ | 3 | *10 |
| 34 | ◎ | ○ | ◎ | ◎ | ◎ | ◎ | ◎ | 3 | *10 |
| 35 | ◎ | ○ | ◎ | X | ◎ | ◎ | ◎ | 0 | *9 |
| 36 | X | X | X | ○ | ◎ | ◎ | ◎ | 0 | *9 |
| 37 | Δ | ○ | ○ | X | ◎ | ◎ | ◎ | 0 | *9 |
| 38 | ◎ | ○ | ◎ | ◎ | X | ◎ | ◎ | 0 | *9 |
| 39 | ◎ | ○ | ◎ | ◎ | X | ◎ | X | 0 | *9 |
| 40 | ◎ | ○ | ◎ | ◎ | X | ◎ | X | 0 | *9 |
| 41 | ◎ | ○ | ◎ | ◎ | X | ◎ | X | 0 | *9 |
| 42 | ◎ | ○ | ◎ | ◎ | X | ◎ | X | 0 | *9 |
| 43 | ◎ | ○ | ◎ | ◎ | X | ◎ | X | 0 | *9 |

*1: TRANSPARENT ELECTRODE NO.
*2: APPLICATION LIQUID STABILITY
*3: GELATION RESISTANCE
*4: EJECTION STABILITY
*5: EXPANSION/CONTRACTION RESISTANCE
*6: TRANSPARENT ELECTRODE
*7: TRANSPARENT CONDUCTIVE LAYER
*8: RECTIFICATION RATIO
*9: COMPARATIVE EXAMPLE
*10: PRESENT INVENTION

As it is clearly understood from the result shown in TABLE 2, when the application liquid composed of the conductive polymer and the water-soluble binder contains a polar solvent having a log P value of −1.50 to −0.45 (compare transparent electrodes 4 and 12 to 23) and 5.0 to 25 mass % of a glycol ether (compare transparent electrodes 1 to 7), the application liquid stability is excellent, a transparent conductive layer of a transparent conductive film without film expansion/contraction even after being dried can be formed, and an organic EL device having an excellent rectification ratio can be manufactured because its thin metal wire is not exposed from the transparent conductive layer.

On the other hand, it is understood that, regardless of the amount of the polar solvent, when the glycol ether is not within the range of one or more embodiments of the invention, the effects to be demonstrated are low (transparent electrodes 8 to 11). It is understood that: as the polar solvent, dimethyl sulfoxide, propylene glycol and ethylene glycol are particularly excellent in ejection stability in inkjet printing; when propylene glycol or dimethyl sulfoxide is used, the rectification ratio of an organic EL device is excellent; and among the three polar solvents, dimethyl sulfoxide in particular is the most excellent in terms of viscosity stability of an application liquid (compare transparent electrodes 4 and 12 to 14).

It is understood that the content of the polar solvent may be within a range from 8.0 to 25 mass % in terms of application liquid stability of a transparent conductive layer forming application liquid (transparent electrodes 4 and 28 to 31). As the glycol ether in the application liquid, a certain amount of ethylene glycol monoalkyl ether or propylene glycol monoalkyl ether makes the application liquid excellent in viscosity stability (compare transparent electrodes 4, 24 and 25 to 27). As the water-soluble binder having a structural unit represented by General Formula (I), any of PHEA, PHEAA and copolymer thereof demonstrated the effects of one or more embodiments of the invention (transparent electrodes 4 and 32 to 34). On the other hand, when no glycol ether was contained (compare transparent electrodes 4 and 35), the coated film was wet-spread, whereas when no polar solvent was contained (compare transparent electrodes 4 and 36), the viscosity increased and gel was generated. Both cases delivered a bad result in the rectification ratios of their organic EL devices.

When neither polar solvent nor glycol ether was contained (compare transparent electrodes 4 and 37), in addition to the viscosity increase, the coated film was contracted, which resulted in decrease in the rectification ratio of an organic EL device. When the conductive polymer described in Published Japanese Translation of PCT International Publication for Patent Application No. 2008-541471 was used, the transparency was low, and also the thin metal wire was repelled, which delivered a bad result in the rectification ratio of its organic EL device (transparent electrodes 4 and 39 to 43).

It is understood that when the polar solvent having a log P value of −1.50 to −0.45 and 8.0 to 20 mass % of a glycol ether are contained, the expansion/contraction resistance increases (compare transparent electrodes 2 to 6).

Second Example

Manufacture of Transparent Electrode (Manufacture of Transparent Electrode 44)

A transparent electrode 44 was manufactured in the same way as the transparent electrode 4 described in First Example, except for using, instead of the transparent conductive layer forming application liquid 4 used for forming the transparent conductive layer 4 in manufacturing the transparent electrode 4, a transparent conductive layer forming application liquid 44 described below.

<Preparation of Transparent Conductive Layer Forming Application Liquid 44>

The transparent conductive layer forming application liquid 44 was prepared in the same way as the transparent conductive layer forming application liquid 4 described in First Example, except for using, instead of 15.9 g of PEDOT-PSS, Clevios PH510 (manufactured by Heraeus Holding, solid concentration; 1.89%, PEDOT:PSS (solid ratio)=1:2.5) as the conductive polymer 1, 17.6 g of PEDOT-PSS Clevios AI4083 (manufactured by Heraeus Holding, solid concentration; 1.7%, PEDOT:PSS (solid ratio)=1:6) as a conductive polymer 4.

(Manufacture of Transparent Electrode 45)

A transparent electrode 45 was manufactured in the same way as the transparent electrode 4 described in First Example, except for using, instead of the transparent conductive layer forming application liquid 4 used for forming the transparent conductive layer 4 in manufacturing the transparent electrode 4, a transparent conductive layer forming application liquid 45 described below.

<Preparation of Transparent Conductive Layer Forming Application Liquid 45>

The transparent conductive layer forming application liquid 45 was prepared in the same way as the transparent conductive layer forming application liquid 4 described in First Example, except for using, instead of 15.9 g of PEDOT-PSS, Clevios PH510 (manufactured by Heraeus Holding, solid concentration; 1.89%, PEDOT:PSS (solid ratio)=1:2.5) as the conductive polymer 1, 10.0 g of PEDOT-PSS Clevios P CH8000 (manufactured by Heraeus Holding, solid concentration; 3.0%, PEDOT:PSS (solid ratio)=1:20) as a conductive polymer 5.

(Manufacture of Transparent Electrode 46)

A transparent electrode 46 was manufactured in the same way as the transparent electrode 4 described in First Example, except for using, instead of the transparent conductive layer forming application liquid 4 used for forming the transparent conductive layer 4 in manufacturing the transparent electrode 4, a transparent conductive layer forming application liquid 46 described below.

<Preparation of Transparent Conductive Layer Forming Application Liquid 46>

The transparent conductive layer forming application liquid 46 was prepared in the same way as the transparent conductive layer forming application liquid 4 described in First Example, except that a dispersion liquid of poly(3,4-ethylenedioxythiophene)/Nafion® (fluorine atom-containing polyanion) having a solid concentration of 2.6% was additionally prepared in accordance with a method described in Example 16 of Japanese Patent No. 4509787, and added thereto at a ratio to be 10 mass % as a solid content.

<Manufacture of Organic EL Device>>

Organic EL devices 44 to 46 were manufactured in the same way as the organic EL device 4 described in First Example, except for respectively using, instead of the transparent electrode 4 used in manufacturing the organic EL device 4, the manufactured transparent electrodes 44 to 46.

<<Evaluation of Transparent Conductive Layer Forming Application Liquid, Transparent Electrode and Organic EL Device>>

The prepared transparent conductive layer forming application liquids, the transparent electrodes and the organic EL devices, which are described above, and the transparent conductive layer forming application liquid 4, the transparent electrode 4 and the organic EL device 4, which are described in First Example, were evaluated in the same way as that described in First Example. The obtained result is shown in TABLE 3.

TABLE 3

| TRANSPARENT ELECTRODE NO. | CONDUCTIVE POLYMER | | | FLUORINE ATOM CONTAINING-POLYANION | APPLICATION LIQUID STABILITY | PROPERTIES | |
|---|---|---|---|---|---|---|---|
| | NO. | PEDOT:PSS (SOLID RATIO) | TRADE NAME | | | GELATION RESISTANCE | EJECTION STABILITY |
| 4 | 1 | 1:2.5 | PH510 | NO | ◎ | ○ | ◎ |
| 44 | 4 | 1:6.0 | AI4083 | NO | ◎ | ○ | ◎ |
| 45 | 5 | 1:20 | CH8000 | NO | ◎ | ○ | ◎ |
| 46 | 1 | 1:2.5 | PH510 | YES | ◎ | ○ | ◎ |

| TRANSPARENT ELECTRODE NO. | TRANSPARENT ELECTRODE PROPERTIES | | CONDUCTIVITY | | ORGANIC EL DEVICE RECTIFICATION RATIO | REMARK |
|---|---|---|---|---|---|---|
| | EXPANSION/ CONTRACTION RESISTANCE | TRANSPARENCY | TRANSPARENT ELECTRODE | TRANSPARENT CONDUCTIVE LAYER | | |
| 4 | ◎ | ◎ | ◎ | ◎ | 3 | PRESENT INVENTION |

TABLE 3-continued

| 44 | ◉ | ◉ | ◉ | ◉ | 3 | PRESENT INVENTION |
| --- | --- | --- | --- | --- | --- | --- |
| 45 | ◉ | ◉ | ◉ | ○ | 3 | PRESENT INVENTION |
| 46 | ◉ | ◉ | ◉ | ◉ | 4 | PRESENT INVENTION |

As it is clearly understood from the result shown in TABLE 3, when the solid ratio of PEDOT:PSS is within a range from 1:2.5 to 1:20, a transparent electrode having a transparent conductive layer excellent in conductivity can be obtained. Further, it is understood from the result of the transparent electrode 4 and the transparent electrode 46 that when a fluorine-containing polyanion (Naion) is used, the rectification ratio of an organic EL device is further improved.

Third Example

Manufacture of Transparent Electrode

[Manufacture of Transparent Electrodes 47 to 53]

Transparent electrodes 47 to 53 were manufactured in the same way as the transparent electrode 4 described in First Example, except for respectively using, instead of the thin metal wire formed by screen printing in manufacturing the transparent electrode 4, thin metal wires 47 to 53 each formed with the pattern and the form (wire width, wire interval and wire height) changed to the structure shown in TABLE 4.

[Manufacture of Transparent Electrode 54]

A transparent electrode 54 was manufactured in the same way as the transparent electrode 4 described in First Example, except for using, instead of the thin metal wire used in manufacturing the transparent electrode 4, a thin metal wire 54 formed by inkjet printing described below.

(Formation of Thin Metal Wire 54: Inkjet Printing)

A silver nanoparticle ink (Harima NPS-J manufactured by Harima Chemicals Group, Inc.) was loaded into an inkjet printing apparatus equipped with, as an inkjet head(s), a piezoelectric inkjet head(s) having a pressure applying means and an electric field applying means and having a nozzle diameter of 25 m, a driving frequency of 12 kHz, 128 nozzles and a nozzle density of 180 dpi (dpi represents the number of dots per inch, namely, per 2.54 cm), and in the area of 3.0 cm×3.0 cm of the 5 cm square glass substrate having a thickness of 0.5 mm, a striped thin metal wire was printed therewith in such a way as to be a wire width of 50 μm, a wire interval of 1.0 mm and a wire height (thickness) of 1.0 μm, and then heated at 250° C. for ten minutes. Thus, the thin metal wire 54 was formed.

[Manufacture of Transparent Electrode 55]

A transparent electrode 55 was manufactured in the same way as the transparent electrode 4 described in First Example, except for using, instead of the thin metal wire used in manufacturing the transparent electrode 4, a thin metal wire 55 formed by direct gravure printing described below.

(Formation of Thin Metal Wire 55: Direct Gravure Printing)

In the area of 3.0 cm×3.0 cm of the 5 cm square glass substrate having a thickness of 0.1 mm, a latticed thin metal wire was printed by direct gravure printing with a silver nanoparticle ink (TEC-PR-020 manufactured by InkTec Co., Ltd.) in such a way as to be a wire width of 50 μm, a wire interval of 1.0 mm and a wire height of 0.2 μm, and then heated at 250° C. for ten minutes. Thus, the thin metal wire 55 was formed.

As a direct gravure printing apparatus, a gravure proofer K303 Multicoater (manufactured by RK Print Coat Instruments, Ltd.) was used.

[Manufacture of Transparent Electrode 56]

A transparent electrode 56 was manufactured in the same way as the transparent electrode 4 described in First Example, except for using, instead of the thin metal wire used in manufacturing the transparent electrode 4, a thin metal wire 56 formed by photolithography described below.

<Formation of Thin Metal Wire 56: Photolithography>

To the area of 3.0 cm×3.0 cm of the 5 cm square glass substrate having a thickness of 0.5 mm, a silver nanoparticle ink (TEC-PA-010 manufactured by InkTec Co., Ltd.) was uniformly applied by spin coating with a condition of a thickness of 1.0 μm, and then dried at 100° C. for five minutes. After that, a striped thin metal wire was formed by photolithography in such a way as to be a wire width of 50 μm, a wire interval of 1.0 mm and a wire height of 1.0 μm, and then heated at 250° C. for ten minutes. Thus, the thin metal wire 56 was formed.

[Manufacture of Transparent Electrode 57]

A transparent electrode 57 was manufactured in the same way as the transparent electrode 4 described in First Example, except for using, instead of the thin metal wire used in manufacturing the transparent electrode 4, a thin metal wire 57 formed by direct gravure printing on a film substrate in accordance with a method described below. In manufacturing the transparent electrode 57, heat treatment was carried out at 150° C. for 60 minutes as a heat treatment condition of a transparent conductive layer 57.

(Formation of Thin Metal Wire 57)

<Manufacture of Film Substrate>

To a 100 μm thick polyethylene naphthalate film (PEN film), a UV curable organic/inorganic hybrid hard coating material OPSTAR Z7501 manufactured by JSR Corporation was applied with a wire bar with a condition that the average thickness after drying became 4 μm, dried at 80° C. for three minutes, and then cured at 1.0 J/cm² as a cure condition under the air atmosphere with a high pressure mercury lamp. Thus a smooth layer was formed.

<Formation of Gas Barrier Layer>

Next, on the film substrate provided with the smooth layer, a gas barrier layer was formed under the conditions below.

1) A 20 mass % dibutyl ether solution of perhydropolysilazane (PHPS, AQUAMICA NN320 manufactured by AZ Electronic Materials pcl) was applied with a wireless bar with a condition that the (average) thickness after drying became 0.30 μm, thereby obtaining an applied sample.

2) Dry treatment: the obtained applied sample was treated under an atmosphere where the temperature was 85° C. and the relative humidity was 55% for one minute, thereby obtaining a dried sample.

3) Dehumidification treatment: the dried sample was kept under an atmosphere where the temperature was 25° C. and the relative humidity was 10% (dew-point temperature of −8° C.) for ten minutes as dehumidification treatment.

4) Modification treatment A: the sample subjected to the dehumidification treatment was modified under the conditions below. Thus, the gas barrier layer was formed. The dew-point temperature at the modification treatment was −8° C.

(A) Modification Device

Device: Excimer irradiation unit Model MECL-M-1-200 manufactured by M.D.COM., Inc.

Wavelength: 172 nm
Lamp filled gas: Xe

The sample fixed onto a movable stage was modified under the conditions below.

(B) Modification Conditions

Excimer laser intensity: 60 mW/cm$^2$ (172 nm)
Distance between sample and light source: 1 mm
Stage heating temperature: 70° C.
Oxygen concentration in irradiation unit: 1%
Excimer laser irradiation time: 3 seconds The film substrate having a gas barrier property was thus manufactured.

<Formation of Thin Metal Wire>

In the area of 3.0 cm×3.0 cm of the 5 cm square film substrate on which the gas barrier layer was formed by the above method, a latticed thin metal wire was printed by direct gravure printing with a silver nanoparticle ink (TEC-PR-020 manufactured by InkTec Co., Ltd.) in such a way as to be a wire width of 50 μm, a wire interval of 1.0 mm and a wire height of 0.2 μm, and then heated at 150° C. for five minutes. Thus, the thin metal wire 57 was formed.

As a direct gravure printing apparatus, a gravure proofer K303 Multicoater (manufactured by RK Print Coat Instruments, Ltd.) was used.

<<Manufacture of Organic EL Device>>

Organic EL devices 47 to 57 were manufactured in the same way as the organic EL device 4 described in First Example, except for respectively using, instead of the transparent electrode 4 used in manufacturing the organic EL device 4, the manufactured transparent electrodes 47 to 57.

<<Measurement of Taper Angle of Thin Metal Wire>>

The taper angle of each of the thin metal wire 1 formed in First Example and the thin metal wires 47 to 56 (57 excluded) formed in manufacturing the above transparent electrodes was photographed with an electron microscope and measured in accordance with the method illustrated in FIG. 1. As a result, the thin metal wires 1 and 47 to 55 formed by various types of printing (screen printing, inkjet printing and direct gravure printing) each had a taper angle of 30° or less, whereas the thin metal wire 56 formed by photolithography had a taper angle of 80° to 900.

<<Evaluation of Transparent Electrode and Organic EL Device>>

The manufactured transparent electrodes and organic EL devices were evaluated in the same way as that described in First Example. The obtained result is shown in TABLE 4.

TABLE 4

| TRANSPARENT ELECTRODE NO. | TRANSPARENT SUBSTRATE | | | THIN METAL WIRE | | | |
|---|---|---|---|---|---|---|---|
| | MATERIAL | THICKNESS (mm) | FORMATION METHOD | PATTERN | WIRE WIDTH (μm) | WIRE INTERVAL (mm) | WIRE HEIGHT (μm) |
| 47 | GLASS | 0.5 | SCREEN PRINTING | STRIPE | 10 | 0.5 | 1.0 |
| 48 | GLASS | 0.5 | SCREEN PRINTING | STRIPE | 100 | 4.0 | 1.0 |
| 49 | GLASS | 0.5 | SCREEN PRINTING | LATTICE | 50 | 1.0 | 1.0 |
| 50 | GLASS | 0.5 | SCREEN PRINTING | STRIPE | 50 | 1.0 | 2.0 |
| 51 | GLASS | 0.5 | SCREEN PRINTING | STRIPE | 50 | 1.0 | 3.0 |
| 52 | GLASS | 0.5 | SCREEN PRINTING | LATTICE | 50 | 0.6 | 2.0 |
| 53 | GLASS | 0.5 | SCREEN PRINTING | LATTICE | 85 | 0.8 | 2.0 |
| 54 | GLASS | 0.5 | INKJET PRINTING | STRIPE | 50 | 1.0 | 1.0 |
| 55 | GLASS | 0.1 | DIRECT GRAVURE PRINTING | LATTICE | 50 | 1.0 | 0.2 |
| 56 | GLASS | 0.5 | PHOTOLITHOGRAPHY | STRIPE | 50 | 1.0 | 1.0 |
| 57 | FILM | 0.1 | DIRECT GRAVURE PRINTING | LATTICE | 70 | 1.0 | 0.2 |

| TRANSPARENT ELECTRODE NO. | TRANSPARENT ELECTRODE PROPERTIES | | | | ORGANIC EL DEVICE RECTIFICATION RATIO | REMARK |
|---|---|---|---|---|---|---|
| | EXPANSION/ CONTRACTION RESISTANCE | TRANSPARENCY | CONDUCTIVITY | | | |
| | | | TRANSPARENT ELECTRODE | TRANSPARENT CONDUCTIVE LAYER | | |
| 47 | ◎ | ◎ | ◎ | ◎ | 3 | PRESENT INVENTION |
| 48 | ◎ | ◎ | ◎ | ◎ | 4 | PRESENT INVENTION |
| 49 | ◎ | ○ | ◎ | ◎ | 3 | PRESENT INVENTION |
| 50 | ◎ | ◎ | ◎ | ◎ | 3 | PRESENT INVENTION |
| 51 | ◎ | ◎ | ◎ | ◎ | 2 | PRESENT INVENTION |
| 52 | ◎ | ○ | ◎ | ◎ | 3 | PRESENT INVENTION |
| 53 | ◎ | ○ | ◎ | ◎ | 4 | PRESENT INVENTION |

TABLE 4-continued

| 54 | ⊚ | ⊚ | ⊚ | ⊚ | 3 | PRESENT INVENTION |
| 55 | ⊚ | ○ | ⊚ | ○ | 4 | PRESENT INVENTION |
| 56 | ⊚ | ⊚ | ⊚ | ⊚ | 2 | PRESENT INVENTION |
| 57 | ○ | ○ | ○ | ○ | 3 | PRESENT INVENTION |

As it is clearly understood from the result shown in TABLE 4, when the height of a thin metal wire is 2 μm or less, the rectification ratio of an organic EL device is excellent (compare transparent electrodes 4, 50 and 51). It is understood that in the case of the same wire width and the same wire interval, the transparency is more excellent when the pattern is striped (compare transparent electrodes 4 and 49). However, even when the pattern is latticed, a transparent electrode which is sufficiently transparent can be manufactured by making a thin metal wire thin (transparent electrodes 49, 52 and 53). Further, when a thin-film glass or film is used as a substrate (transparent electrodes 55 and 57), a bendable organic EL device which uniformly emits light (transparent electrodes 55 and 57) can be manufactured. Further, it is understood that when printing is used as a formation method for a thin metal wire, the rectification ratio of an organic EL device is better as compared with when photolithography is used (compare transparent electrodes 4, 54, 55 and 56).

(conductive polymer-dispersed dispersion liquid ink, solid concentration; 2.5%, manufactured by Nissan Chemical Industries, Ltd.).

<<Manufacture of Organic EL Device 58>>

An organic EL device 58 was manufactured in the same way as the organic EL device 4 described in First Example, except for using, instead of the transparent electrode 4 used in manufacturing the organic EL device 4, the manufactured transparent electrode 58.

<<Evaluation of Transparent Conductive Layer Forming Application Liquid, Transparent Electrode and Organic EL Device>>

The prepared transparent conductive layer forming application liquid 58, the transparent electrode 58 and the organic EL device 58 were evaluated in the same way as that described in First Example. The obtained result is shown in TABLE 5.

TABLE 5

| | APPLICATION LIQUID PROPERTIES | | | TRANSPARENT ELECTRODE PROPERTIES | | CONDUCTIVITY | | ORGANIC EL DEVICE | |
| --- | --- | --- | --- | --- | --- | --- | --- | --- | --- |
| TRANSPARENT ELECTRODE NO. | APPLICATION LIQUID STABILITY | GELATION RESISTANCE | EJECTION STABILITY | EXPANSION/ CONTRACTION RESISTANCE | TRANSPARENCY | TRANSPARENT ELECTRODE | TRANSPARENT CONDUCTIVE LAYER | RECTIFICATION RATIO | REMARK |
| 58 | ⊚ | ○ | ⊚ | ⊚ | ⊚ | ⊚ | ⊚ | 3 | PRESENT INVENTION |

Fourth Example

Manufacture of Transparent Electrode 58

A transparent electrode 58 was manufactured in the same way as the transparent electrode 4 described in First Example, except for using, instead of the transparent conductive layer forming application liquid 4 used for forming the transparent conductive layer 4 in manufacturing the transparent electrode 4, a transparent conductive layer forming application liquid 58 described below.

<Preparation of Transparent Conductive Layer Forming Application Liquid 58>

The transparent conductive layer forming application liquid 58 was prepared in the same way as the transparent conductive layer forming application liquid 4 described in the First Example, except for using, instead of 15.9 g of PEDOT-PSS, Clevios PH510 (manufactured by Heraeus Holding, solid concentration; 1.89%, PEDOT:PSS (solid ratio)=1:2.5) as the conductive polymer 1, 12.0 g of a conductive polyaniline dispersion liquid ORMECON® Ink As it is clearly understood from the result shown in TABLE 5, even when polyaniline is used as the conductive polymer in the transparent conductive layer forming application liquid, the effects which are the same as those demonstrated in First Example are obtained.

Fifth Example

Manufacture of Transparent Electrode

[Manufacture of Transparent Electrode 59]

A transparent electrode 59 was manufactured in the same way as the transparent electrode 4 described in First Example, except that a transparent conductive layer 59 was formed by, instead of inkjet printing used as the formation method for the transparent conductive layer 4 in manufacturing the transparent electrode 4, extrusion coating.

[Manufacture of Transparent Electrode 60]

A transparent electrode 60 was manufactured in the same way as the transparent electrode 4 described in First Example, except that a transparent conductive layer 60 was formed by, instead of inkjet printing used as the formation method for the transparent conductive layer 4 in manufacturing the transparent electrode 4, bar coating. For bar coating, a type of a bar coater was selected with which the dry thickness became 400 nm.

<<Manufacture of Organic EL Device>>

Organic EL devices 59 and 60 were manufactured in the same way as the organic EL device 4 described in First Example, except for respectively using, instead of the transparent electrode 4 used in manufacturing the organic EL device 4, the manufactured transparent electrodes 59 and 60.

<<Evaluation of Transparent Electrode and Organic EL Device>>

The manufactured transparent electrodes and organic EL devices were evaluated in the same way as that described in First Example. The obtained result is shown in TABLE 6.

DESCRIPTION OF REFERENCE NUMERALS

1 Taper Angle
2 Transparent Substrate
3 Thin Metal Wire
2 Inkjet Head
4 Waste Liquid Tank
5 Control Unit
6 Tank
7 Tank
8A Tank
8B Tank
9 Pump
11 Pump
12 Filter
13 Pipe Branching Part

TABLE 6

| TRANSPARENT ELECTRODE NO. | TRANSPARENT CONDUCTIVE LAYER COATING | TRANSPARENT ELECTRODE PROPERTIES | | | | ORGANIC EL DEVICE RECTIFICATION RATIO | REMARK |
|---|---|---|---|---|---|---|---|
| | | EXPANSION/ CONTRACTION RESISTANCE | TRANS- PARENCY | CONDUCTIVITY | | | |
| | | | | TRANSPARENT ELECTRODE | TRANSPARENT CONDUCTIVE LAYER | | |
| 59 | EXTRUSION COATING | ◎ | ◎ | ◎ | ◎ | 2 | PRESENT INVENTION |
| 60 | BAR COATING | ◎ | ◎ | ◎ | ◎ | 2 | PRESENT INVENTION |

As it is clearly understood from the result shown in TABLE 6, even when coating (extrusion coating and bar coating) other than inkjet printing is used as the formation method for a transparent conductive layer, the effects which are the same as those demonstrated in First Example are obtained, but the rectification ratio of an organic EL device is somewhat lower as compared with when inkjet printing is used, and therefore inkjet printing is more excellent as the formation method for a transparent conductive layer.

Sixth Example

Organic thin film solar cells were provided with the transparent electrodes 1 to 24 of one or more embodiments of the invention, so that organic electronic devices having an excellent rectification ratio were obtained, like the organic EL devices 1 to 24.

INDUSTRIAL APPLICABILITY

The transparent electrode of one or more embodiments of the invention has both high conductivity and high transparency and is suitably usable in the fields of: various optoelectronics devices, such as crystal liquid display devices, organic luminescent devices, inorganic electroluminescent devices, electronic paper, organic solar cells and inorganic solar cells; electromagnetic shields; touch panels; and so forth.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

100 Transparent Substrate
102 Second Electrode
104 Thin Metal Wire
105 Transparent Conductive Layer
109 Sealing Member
109a Adhesive Layer
110 Organic Functional Layer
112 Positive Hole Transport Layer
114 Luminescent Layer
116 Positive Hole Block Layer
118 Electron Transport Layer
201b Piezoelectric Substrate
201c Top Plate
201d Nozzle Plate
201e Application Liquid Supply Pipe
201f Pipe

The invention claimed is:

1. A transparent electrode manufacturing method for manufacturing a transparent electrode by forming a thin metal wire and a transparent conductive layer on a transparent substrate, the method comprising:
a step of forming the thin metal wire on the transparent substrate; and
a step of forming the transparent conductive layer on the transparent substrate and the thin metal wire, wherein
the step of forming the transparent conductive layer is a step of forming the transparent conductive layer by applying a transparent conductive layer forming application liquid onto the transparent substrate and the thin metal wire by printing, and
the transparent conductive layer forming application liquid prevents wet-spreading and is composed of 1) a conductive polymer, 2) a water-soluble binder having a structural unit represented by the following general formula (I), 3) a polar solvent having a log P value of −1.50 to −0.45, and 4) 5.0 to 25 mass % of a glycol ether,

[Chem. 1]

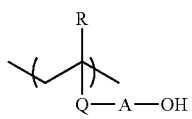

General Formula (I)

in the general formula (I), R represents a hydrogen atom or a methyl group; Q represents C(=O)O or C(=O)NRa, and Ra represents an atomic group to form a morpholine group with a hydrogen atom, an alkyl group or a nitrogen atom; and A represents a substituted or non-substituted alkylene group or $(CH_2CHRbO)_x$—$(CH_2CHRb)$, Rb represents a hydrogen atom or an alkyl group, and x represents a number of 0 to 100 as an average number of repeating units.

2. The transparent electrode manufacturing method according to claim 1, wherein the polar solvent is a propylene glycol or a dimethyl sulfoxide.

3. The transparent electrode manufacturing method according to claim 2, wherein the glycol ether is an ethylene glycol monoalkyl ether or a propylene glycol monoalkyl ether.

4. The transparent electrode manufacturing method according to claim 1, wherein a content of the polar solvent in the transparent conductive layer forming application liquid is 8.0 to 25 mass % in the total mass of the transparent conductive layer forming application liquid.

5. The transparent electrode manufacturing method according to claim 1, wherein the conductive polymer has a π-conjugated conductive polymer component A and a polyanion component B, and a mass ratio (A:B) of a solid content of the π-conjugated conductive polymer component A to a solid content of the polyanion component B in the conductive polymer is 1:1 to 1:10.

6. The transparent electrode manufacturing method according to claim 5, wherein the polyanion component B constituting the conductive polymer has a fluorine atom.

7. The transparent electrode manufacturing method according to claim 1, wherein the printing used for forming the transparent conductive layer is inkjet printing.

8. The transparent electrode manufacturing method according to claim 1, wherein the thin metal wire is formed with a stripe pattern having a wire width of 10 to 100 μm, a wire interval of 0.5 to 4.0 mm and a wire height of 0.1 to 2.0 μm.

9. The transparent electrode manufacturing method according to claim 1, wherein the thin metal wire is formed with a lattice pattern having a wire width of 10 to 100 μm, a wire interval of 0.5 to 4.0 mm and a wire height of 0.1 to 2.0 μm.

10. The transparent electrode manufacturing method according to claim 1, wherein the thin metal wire is formed by printing.

11. The transparent electrode manufacturing method according to claim 1, wherein the transparent substrate is a glass substrate.

12. The transparent electrode manufacturing method according to claim 1, wherein the glycol ether is an ethylene glycol monoalkyl ether or a propylene glycol monoalkyl ether.

13. The transparent electrode manufacturing method according to claim 2, wherein a content of the polar solvent in the transparent conductive layer forming application liquid is 8.0 to 25 mass % in the total mass of the transparent conductive layer forming application liquid.

14. The transparent electrode manufacturing method according to claim 3, wherein a content of the polar solvent in the transparent conductive layer forming application liquid is 8.0 to 25 mass % in the total mass of the transparent conductive layer forming application liquid.

15. The transparent electrode manufacturing method according to claim 3, wherein the conductive polymer has a π-conjugated conductive polymer component A and a polyanion component B, and a mass ratio (A:B) of a solid content of the π-conjugated conductive polymer component A to a solid content of the polyanion component B in the conductive polymer is 1:1 to 1:10.

16. The transparent electrode manufacturing method according to claim 12, wherein the conductive polymer has a π-conjugated conductive polymer component A and a polyanion component B, and a mass ratio (A:B) of a solid content of the π-conjugated conductive polymer component A to a solid content of the polyanion component B in the conductive polymer is 1:1 to 1:10.

17. The transparent electrode manufacturing method according to claim 15, wherein the polyanion component B constituting the conductive polymer has a fluorine atom.

* * * * *